United States Patent
Li et al.

(10) Patent No.: US 11,323,188 B2
(45) Date of Patent: May 3, 2022

(54) MONITORING SYSTEMS AND METHODS FOR RADIOS IMPLEMENTED WITH DIGITAL PREDISTORTION

(71) Applicant: NanoSemi, Inc, Waltham, MA (US)

(72) Inventors: Yan Li, Lexington, MA (US); Helen H. Kim, Sudbury, MA (US); George Stone, IV, Hollis, NH (US); Shijun Li, Waltham, MA (US)

(73) Assignee: NanoSemi, Inc., Waltham, MA (US)

( * ) Notice: Subject to any disclaimer, the term of this patent is extended or adjusted under 35 U.S.C. 154(b) by 0 days.

(21) Appl. No.: 16/630,107

(22) PCT Filed: Jul. 12, 2018

(86) PCT No.: PCT/US2018/041773
§ 371 (c)(1),
(2) Date: Jan. 10, 2020

(87) PCT Pub. No.: WO2019/014422
PCT Pub. Date: Jan. 17, 2019

(65) Prior Publication Data
US 2020/0169334 A1    May 28, 2020

Related U.S. Application Data

(60) Provisional application No. 62/531,646, filed on Jul. 12, 2017.

(51) Int. Cl.
*H04B 1/04*        (2006.01)
*H04B 17/15*       (2015.01)
(Continued)

(52) U.S. Cl.
CPC ........... *H04B 17/15* (2015.01); *H03F 1/3241* (2013.01); *H04B 1/0475* (2013.01); *H03F 3/20* (2013.01);
(Continued)

(58) Field of Classification Search
CPC ... G06F 17/30; H03F 1/32; H03F 1/34; H03F 1/3241; H03F 1/3247; H03F 1/3258;
(Continued)

(56) References Cited

U.S. PATENT DOCUMENTS 4,979,126 A    12/1990    Pao et al.
5,819,165 A    10/1998    Hulkko et al.
(Continued)

FOREIGN PATENT DOCUMENTS

CN    1938939 A      3/2007
CN    101379718 A    3/2009
(Continued)

OTHER PUBLICATIONS

Aguirre, et al., "On the Interpretation and Practice of Dynamical Differences Between Hammerstein and Wiener Models", IEEE Proceedings on Control TheoryAppl; vol. 152, No. 4, Jul. 2005, pp. 349-356.
(Continued)

*Primary Examiner* — Shawkat M Ali
(74) *Attorney, Agent, or Firm* — Occhiuti & Rohlicek LLP

(57) ABSTRACT

Disclosed are implementations, including a method for monitoring a performance of a transmitter in a radio with an adjustable digital predistortion system. The method includes determining a plurality of system characteristics, including determining one or more of, for example, data characterizing an input/output characteristic of a digital predistorter of the system, data characterizing a performance of a crest factor reduction process of the system, data characterizing a quality of a plurality of parameters associated with the digital predistorter, data characterizing an average time delay associated with the system, data characterizing an average gain associated with the system, and/or data characterizing a
(Continued)

phase associated with the system. The method further includes comparing one or more of the plurality of system characteristics to respective one or more reference values, and controlling the adjustable digital predistortion system based on a result of the comparing.

23 Claims, 4 Drawing Sheets

(51) Int. Cl.
  *H03F 1/32* (2006.01)
  *H03F 3/20* (2006.01)
(52) U.S. Cl.
  CPC .................. *H03F 2200/451* (2013.01); *H04B 2001/0408* (2013.01)
(58) Field of Classification Search
  CPC .... H03F 3/19; H03F 1/27; H04B 1/04; H04B 1/0475; H04B 17/15; H04K 1/02; H04L 25/03; H04L 25/49; H04L 27/34; H04W 84/04
  USPC ........... 375/219, 224, 295–297; 455/91, 108, 455/114.3, 115.1, 126
  See application file for complete search history.

(56) References Cited

U.S. PATENT DOCUMENTS

| | | |
|---|---|---|
| 5,980,457 A | 11/1999 | Averkiou |
| 6,052,412 A | 4/2000 | Ruether et al. |
| 6,240,278 B1 | 5/2001 | Midya et al. |
| 6,288,610 B1 | 9/2001 | Miyashita |
| 6,549,067 B1 | 4/2003 | Kenington |
| 7,142,615 B2 | 11/2006 | Hongo et al. |
| 7,170,344 B2 | 1/2007 | Suzuki et al. |
| 7,289,773 B2 | 10/2007 | Braithwaite |
| 7,295,815 B1 | 11/2007 | Wright et al. |
| 7,321,264 B2 | 1/2008 | Kokkeler |
| 7,333,557 B2 | 2/2008 | Rashev et al. |
| 7,469,491 B2 | 12/2008 | McCallister et al. |
| 7,529,652 B1 | 5/2009 | Gahinet et al. |
| 7,577,211 B2 | 8/2009 | Braithwaite |
| 7,599,431 B1 | 10/2009 | Anderson et al. |
| 7,634,238 B2 | 12/2009 | Suzuki et al. |
| 7,796,960 B1 | 9/2010 | Rashev et al. |
| 7,904,033 B1 | 3/2011 | Wright et al. |
| 8,121,560 B1 | 2/2012 | Anaraki et al. |
| 8,185,066 B2 | 5/2012 | Camp, Jr. et al. |
| 8,306,149 B2 | 11/2012 | Mujica et al. |
| 8,391,809 B1 | 3/2013 | Fuller |
| 8,411,730 B2 | 4/2013 | Maeda |
| 8,446,979 B1 | 5/2013 | Yee |
| 8,498,590 B1 | 7/2013 | Rashev et al. |
| 8,519,789 B2 | 8/2013 | Hawkes |
| 8,576,941 B2 | 11/2013 | Bai |
| 8,644,437 B2 | 2/2014 | Kim et al. |
| 8,666,336 B1 | 3/2014 | Dick |
| 8,711,976 B2 | 4/2014 | Chandrasekaran |
| 8,731,005 B2 | 5/2014 | Schlee |
| 8,731,105 B2 | 5/2014 | Bai |
| 8,890,609 B2 | 11/2014 | Laporte |
| 9,071,207 B2 | 6/2015 | Bai |
| 9,130,628 B1 | 9/2015 | Mittal et al. |
| 9,173,173 B2 | 10/2015 | Wei et al. |
| 9,184,710 B2 | 11/2015 | Braithwaite |
| 9,226,189 B1 | 12/2015 | Kularatna et al. |
| 9,252,712 B2 | 2/2016 | Li et al. |
| 9,331,882 B2 | 5/2016 | Fehri et al. |
| 9,337,782 B1 | 5/2016 | Mauer et al. |
| 9,467,954 B2 * | 10/2016 | Cao ...................... H03F 1/3223 |
| 9,509,350 B1 * | 11/2016 | Magesacher ............ H03F 3/189 |
| 9,564,876 B2 | 2/2017 | Kim et al. |
| 9,590,668 B1 | 3/2017 | Kim et al. |
| 9,595,920 B2 | 3/2017 | Li et al. |
| 9,614,557 B1 | 4/2017 | Mayer et al. |
| 9,621,236 B2 | 4/2017 | Ghannouchi et al. |
| 9,628,119 B2 | 4/2017 | Gal et al. |
| 9,628,120 B2 * | 4/2017 | Yu ............................ H03F 3/24 |
| 9,722,646 B1 | 8/2017 | Matthews et al. |
| 9,749,161 B1 | 8/2017 | Gal et al. |
| 9,831,899 B1 | 11/2017 | Boghrat et al. |
| 9,935,810 B1 | 4/2018 | Hammler et al. |
| 9,973,370 B1 | 5/2018 | Langer et al. |
| 10,033,413 B2 | 7/2018 | Pratt |
| 10,033,414 B2 | 7/2018 | Ota |
| 10,079,699 B1 | 9/2018 | Li et al. |
| 10,080,178 B2 | 9/2018 | Stapleton et al. |
| 10,141,896 B2 | 11/2018 | Huang |
| 10,141,961 B1 | 11/2018 | Huang et al. |
| 10,181,914 B2 | 1/2019 | Li et al. |
| 10,404,296 B2 | 9/2019 | Kim et al. |
| 10,447,511 B2 | 10/2019 | Xie et al. |
| 10,469,109 B2 | 11/2019 | Gutman et al. |
| 10,523,159 B2 | 12/2019 | Megretski et al. |
| 10,581,470 B2 | 3/2020 | Megretski et al. |
| 10,623,118 B2 | 4/2020 | Lagoy et al. |
| 10,644,657 B1 | 5/2020 | Megretski et al. |
| 10,763,904 B2 | 9/2020 | Megretski et al. |
| 10,812,166 B2 | 10/2020 | Kim et al. |
| 10,826,739 B1 | 11/2020 | Fomin et al. |
| 2001/0050592 A1 | 12/2001 | Wright et al. |
| 2002/0080891 A1 | 6/2002 | Ahn et al. |
| 2003/0058960 A1 | 3/2003 | Lee |
| 2003/0184374 A1 | 10/2003 | Huang et al. |
| 2003/0207680 A1 | 11/2003 | Yang et al. |
| 2004/0076247 A1 | 4/2004 | Barak et al. |
| 2004/0116083 A1 | 6/2004 | Suzuki et al. |
| 2004/0121741 A1 | 6/2004 | Rashev et al. |
| 2004/0142667 A1 | 7/2004 | Lochhead et al. |
| 2004/0196922 A1 | 10/2004 | Leffel |
| 2005/0001684 A1 | 1/2005 | Braithwaite |
| 2005/0163251 A1 | 7/2005 | McCallister |
| 2005/0163252 A1 | 7/2005 | McCallister et al. |
| 2005/0163268 A1 | 7/2005 | McCallister |
| 2005/0180527 A1 | 8/2005 | Suzuki et al. |
| 2005/0190857 A1 | 9/2005 | Braithwaite |
| 2006/0022751 A1 | 2/2006 | Fuller et al. |
| 2006/0154622 A1 | 7/2006 | Piirainen |
| 2006/0229036 A1 | 10/2006 | Muller et al. |
| 2006/0276147 A1 | 12/2006 | Suzuki |
| 2007/0091992 A1 | 4/2007 | Dowling |
| 2007/0230557 A1 | 10/2007 | Balasubramonian et al. |
| 2007/0241812 A1 | 10/2007 | Yang et al. |
| 2008/0003945 A1 | 1/2008 | Wenham |
| 2008/0019453 A1 | 1/2008 | Zhao et al. |
| 2008/0039045 A1 | 2/2008 | Filipovic et al. |
| 2008/0049868 A1 * | 2/2008 | Brobston ............... H04L 27/368 375/297 |
| 2008/0057882 A1 | 3/2008 | Singeri |
| 2008/0085684 A1 | 4/2008 | Phillips et al. |
| 2008/0101502 A1 | 5/2008 | Navidpour et al. |
| 2008/0247487 A1 | 10/2008 | Cai et al. |
| 2008/0260066 A1 | 10/2008 | Cai et al. |
| 2008/0268794 A1 | 10/2008 | Mege et al. |
| 2008/0268795 A1 | 10/2008 | Saed |
| 2008/0285640 A1 | 11/2008 | McCallister |
| 2009/0201084 A1 | 8/2009 | See et al. |
| 2010/0019983 A1 | 1/2010 | Bonnet et al. |
| 2010/0026354 A1 | 2/2010 | Utsunomiya et al. |
| 2010/0048149 A1 | 2/2010 | Tang et al. |
| 2010/0225390 A1 | 9/2010 | Brown et al. |
| 2010/0297966 A1 | 11/2010 | Row et al. |
| 2011/0044158 A1 | 2/2011 | Tao et al. |
| 2011/0085490 A1 | 4/2011 | Schlee |
| 2011/0098011 A1 | 4/2011 | Camp, Jr. et al. |
| 2011/0128992 A1 | 6/2011 | Maeda et al. |
| 2011/0135035 A1 | 6/2011 | Bose et al. |
| 2011/0150130 A1 | 6/2011 | Kenington |
| 2011/0156815 A1 | 6/2011 | Kim et al. |
| 2011/0163806 A1 | 7/2011 | Hongo |
| 2011/0187437 A1 | 8/2011 | Perreault et al. |

(56) References Cited

U.S. PATENT DOCUMENTS

| | | |
|---|---|---|
| 2011/0235734 A1 | 9/2011 | Kenington |
| 2011/0255627 A1 | 10/2011 | Gotman et al. |
| 2011/0273234 A1 | 11/2011 | Van der Heijden et al. |
| 2011/0273236 A1 | 11/2011 | Heijden et al. |
| 2012/0093210 A1 | 4/2012 | Schmidt et al. |
| 2012/0108189 A1 | 5/2012 | McCallister et al. |
| 2012/0119810 A1 | 5/2012 | Bai |
| 2012/0119811 A1 | 5/2012 | Bai et al. |
| 2012/0119831 A1 | 5/2012 | Bai |
| 2012/0147993 A1 | 6/2012 | Kim et al. |
| 2012/0154033 A1 | 6/2012 | Lozhkin |
| 2012/0154430 A1 | 6/2012 | Matsushima et al. |
| 2012/0176195 A1 | 7/2012 | Dawson et al. |
| 2012/0194271 A1 | 8/2012 | Yamamoto et al. |
| 2012/0199810 A1 | 8/2012 | Lee |
| 2012/0200355 A1 | 8/2012 | Braithwaite |
| 2012/0219048 A1 | 8/2012 | Camuffo et al. |
| 2012/0286865 A1 | 11/2012 | Chandrasekaran |
| 2012/0286985 A1 | 11/2012 | Chandrasekaran et al. |
| 2012/0293252 A1 | 11/2012 | Sorrells et al. |
| 2012/0295558 A1 | 11/2012 | Wang et al. |
| 2013/0033317 A1 | 2/2013 | Hawkes |
| 2013/0034188 A1 | 2/2013 | Rashev et al. |
| 2013/0044791 A1 | 2/2013 | Rimini et al. |
| 2013/0064325 A1 | 3/2013 | Kilambi et al. |
| 2013/0094610 A1 | 4/2013 | Ghannouchi et al. |
| 2013/0094612 A1 | 4/2013 | Kim et al. |
| 2013/0163512 A1 | 6/2013 | Rexberg et al. |
| 2013/0243121 A1 | 9/2013 | Bai |
| 2013/0251065 A1 | 9/2013 | Bai |
| 2013/0259159 A1 | 10/2013 | McCallister et al. |
| 2013/0329833 A1 | 12/2013 | Bai |
| 2014/0009225 A1 | 1/2014 | Laporte |
| 2014/0016725 A1 | 1/2014 | Peroulas et al. |
| 2014/0038659 A1 | 2/2014 | Wei et al. |
| 2014/0139286 A1 | 5/2014 | Laporte |
| 2014/0161159 A1 | 6/2014 | Black et al. |
| 2014/0161207 A1 | 6/2014 | Teterwak |
| 2014/0177695 A1 | 6/2014 | Cha et al. |
| 2014/0187182 A1 | 7/2014 | Yan et al. |
| 2014/0254716 A1 | 9/2014 | Zhou et al. |
| 2014/0274105 A1 | 9/2014 | Wang |
| 2014/0292579 A1 | 10/2014 | Oh et al. |
| 2014/0347126 A1 | 11/2014 | Laporte et al. |
| 2015/0043313 A1 | 2/2015 | Stranczl et al. |
| 2015/0043323 A1 | 2/2015 | Choi et al. |
| 2015/0043678 A1 | 2/2015 | Hammi |
| 2015/0049841 A1 | 2/2015 | Laporte et al. |
| 2015/0061761 A1 | 3/2015 | Wills et al. |
| 2015/0103952 A1 | 4/2015 | Wang et al. |
| 2015/0123735 A1 | 5/2015 | Wimpenny |
| 2015/0124907 A1 | 5/2015 | Li et al. |
| 2015/0171768 A1 | 6/2015 | Perreault |
| 2015/0325913 A1 | 11/2015 | Vagman |
| 2015/0326349 A1 | 11/2015 | Yang et al. |
| 2015/0333781 A1 | 11/2015 | Alon et al. |
| 2015/0357975 A1 | 12/2015 | Avniel et al. |
| 2015/0358039 A1 | 12/2015 | Xiong et al. |
| 2015/0372745 A1* | 12/2015 | Abe ............... H04B 1/1027 375/232 |
| 2015/0381216 A1 | 12/2015 | Shor et al. |
| 2015/0381220 A1 | 12/2015 | Gal et al. |
| 2016/0013820 A1 | 1/2016 | Yamanouchi |
| 2016/0028433 A1 | 1/2016 | Ding et al. |
| 2016/0034421 A1 | 2/2016 | Magesacher et al. |
| 2016/0043753 A1 | 2/2016 | Jungnickel et al. |
| 2016/0065147 A1 | 3/2016 | Pratt et al. |
| 2016/0087604 A1 | 3/2016 | Kim et al. |
| 2016/0094253 A1 | 3/2016 | Weber et al. |
| 2016/0095110 A1 | 3/2016 | Li et al. |
| 2016/0100180 A1 | 4/2016 | Oh |
| 2016/0112222 A1 | 4/2016 | Pashay-Kojouri et al. |
| 2016/0174118 A1 | 6/2016 | Duan et al. |
| 2016/0191020 A1 | 6/2016 | Velazquez |
| 2016/0211577 A1 | 7/2016 | Miller et al. |
| 2016/0218891 A1* | 7/2016 | Nammi ............ H04L 25/03343 |
| 2016/0241277 A1 | 8/2016 | Rexberg et al. |
| 2016/0249300 A1 | 8/2016 | Tsai et al. |
| 2016/0285485 A1 | 9/2016 | Fehri et al. |
| 2016/0308577 A1 | 10/2016 | Molina et al. |
| 2016/0336906 A1 | 11/2016 | Lee et al. |
| 2016/0373072 A1 | 12/2016 | Magesacher et al. |
| 2017/0005627 A1 | 1/2017 | Zhao et al. |
| 2017/0033969 A1 | 2/2017 | Yang et al. |
| 2017/0041124 A1 | 2/2017 | Khandani |
| 2017/0047899 A1 | 2/2017 | Abdelrahman et al. |
| 2017/0077981 A1 | 3/2017 | Tobisu et al. |
| 2017/0176507 A1 | 6/2017 | O'Keeffe et al. |
| 2017/0201275 A1 | 7/2017 | Tabatabai et al. |
| 2017/0214438 A1 | 7/2017 | Ghannouchi et al. |
| 2017/0237455 A1 | 8/2017 | Ye et al. |
| 2017/0244582 A1 | 8/2017 | Gal et al. |
| 2017/0302233 A1 | 10/2017 | Huang |
| 2017/0338841 A1 | 11/2017 | Pratt |
| 2018/0097530 A1 | 4/2018 | Yang et al. |
| 2018/0159568 A1 | 6/2018 | Matsuura et al. |
| 2018/0167092 A1 | 6/2018 | Hausmair et al. |
| 2018/0191537 A1 | 7/2018 | Xiong et al. |
| 2018/0287569 A1 | 10/2018 | Xu et al. |
| 2018/0337700 A1 | 11/2018 | Huang et al. |
| 2019/0007075 A1 | 1/2019 | Kim et al. |
| 2019/0097662 A1 | 3/2019 | Hornbuckle et al. |
| 2019/0104000 A1 | 4/2019 | Xie et al. |
| 2019/0238204 A1 | 8/2019 | Kim et al. |
| 2019/0260401 A1 | 8/2019 | Megretski et al. |
| 2019/0260402 A1 | 8/2019 | Chuang et al. |
| 2019/0348956 A1 | 11/2019 | Megretski et al. |
| 2019/0363676 A1 | 11/2019 | Megretski et al. |
| 2019/0363742 A1 | 11/2019 | Megretski et al. |
| 2020/0028476 A1 | 1/2020 | Kim et al. |
| 2020/0067543 A1 | 2/2020 | Kim et al. |
| 2020/0119755 A1 | 4/2020 | Mahmood et al. |

FOREIGN PATENT DOCUMENTS

| | | |
|---|---|---|
| CN | 101971507 A | 2/2011 |
| CN | 103201949 A | 7/2013 |
| CN | 104796170 A | 7/2015 |
| CN | 104871433 A | 8/2015 |
| CN | 105634539 A | 6/2016 |
| CN | 106464280 A | 2/2017 |
| EP | 0916967 | 5/1999 |
| EP | 1560329 A1 | 8/2005 |
| EP | 1732208 A1 | 12/2006 |
| EP | 2991221 A1 | 3/2016 |
| JP | 2005-065211 A | 3/2005 |
| JP | 2010-136123 A | 6/2010 |
| JP | 1813995 B2 | 11/2011 |
| JP | 2013-542696 A | 11/2013 |
| JP | 2014-533017 A | 12/2014 |
| KR | 20100040497 A | 4/2010 |
| WO | 20120154430 A1 | 11/2012 |
| WO | 2015107392 A1 | 7/2015 |
| WO | 2018156932 A1 | 8/2018 |
| WO | 2018/227111 | 12/2018 |
| WO | 2018227093 A1 | 12/2018 |
| WO | 2019/014422 A1 | 1/2019 |
| WO | 2019031714 A1 | 2/2019 |
| WO | 2019070573 A1 | 4/2019 |
| WO | 2019094713 A1 | 5/2019 |
| WO | 2019094720 A1 | 5/2019 |

OTHER PUBLICATIONS

Barradas, et al. "Polynomials and LUTs in PA Behavioral Modeling: A Fair Theoretical Comparison", IEEE Transactions on Microwave Theory and Techniques; vol. 62, No. 12, Dec. 2014, pp. 3274-3285.

Bosch et al. "Measurement and Simulation of Memory Effects in Predistortion Linearizers," IEEE Transactions on Mircrowave Theory and Techniques; vol. 37.No. 12; Dec. 1989, pp. 1885-1890.

Braithwaite, et al. "Closed-Loop Digital Predistortion (DPD) Using an Observation Path with Limited Bandwidth" IEEE Transactions

(56) References Cited

OTHER PUBLICATIONS on Microwave Theory and Techniques; vol. 63, No. 2; Feb. 2015, pp. 726-736.
Cavers, "Amplifier Linearization Using a Digital Predistorter with Fast Adaption and Low Memory Requirements;" IEEE Transactions on Vehicular Technology; vol. 39; No. 4; Nov. 1990, pp. 374-382.
D'Andrea et al., "Nonlinear Predistortion of OFDM Signals over Frequency-Selective Fading Channels," IEEE Transactions on Communications; vol. 49; No. 5, May 2001; pp. 837-843.
Guan, et al. "Optimized Low-Complexity Implementation of Least Squares Based Model Extraction of Digital Predistortion of RF Power Amplifiers", IEEE Transactions on Microwave Theory and Techniques; vol. 60, No. 3, Mar. 2012; pp. 594-603. cited byapplicant.
Henrie, et al., "Cancellation of Passive Intermodulation Distortion in Microwave Networks", Proceedings of the 38.sup.th European Microwave Conference, Oct. 2008, Amsterdam, The Netherlands, pp. 1153-1156.
Hong et al., "Weighted Polynomial Digital Predistortion for Low Memory Effect Doherty Power Amplifier," IEEE Transactions on Microwave Theory and Techniques; vol. 55; No. 5, May 2007, pp. 925-931.
Kwan, et al., "Concurrent Multi-Band Envelope Modulated Power Amplifier Linearized Using Extended Phase-Aligned DPD", IEEE Transactions on Microwave Theory and Techniques; vol. 62, No. 12, Dec. 2014, pp. 3298-3308.
Lajoinie et al. Efficient Simulation of NPR for the Optimum Design of Satellite Transponders SSPAs, EEE MTT-S International; vol. 2; Jun. 1998; pp. 741-744.
Li et al. "High-Throughput Signal Component Separator for Asymmetric Multi-Level Outphasing Power Amplifiers," IEEE Journal of Solid-State Circuits; vol. 48; No. 2; Feb. 2013; pp. 369-380.
Liang, et al. "A Quadratic-Interpolated Lut-Based Digital Predistortion Techniques for Cellular Power Amplifiers", IEEE Transactions on Circuits and Systems; II: Express Briefs, vol. 61, No. 3, Mar. 2014; pp. 133-137.
Liu, et al. "Digital Predistortion for Concurrent Dual-Band Transmitters Using 2-D Modified Memory Polynomials", IEEE Transactions on Microwave Theory and Techniques, vol. 61, No. 1, Jan. 2013, pp. 281-290.
Molina, et al. "Digital Predistortion Using Lookup Tables with Linear Interpolation and Extrapolation: Direct Least Squares Coefficient Adaptation", IEEE Transactions on Microwave Theory and Techniques, vol. 65, No. 3, Mar. 2017; pp. 980-987.
Morgan, et al. "A Generalized Memory Polynomial Model for Digital Predistortion of RF Power Amplifiers," IEEE Transactions of Signal Processing; vol. 54; No. 10; Oct. 2006; pp. 3852-3860.
Muta et al., "Adaptive predistortion linearization based on orthogonal polynomial expansion for nonlinear power amplifiers in OFDM systems", Communications and Signal Processing (ICCP), International Conference on, IEEE, pp. 512-516, 2011.
Naraharisetti, et a., "2D Cubic Spline Implementation for Concurrent Dual-Band System", IEEE, 2013, pp. 1-4.
Naraharisetti, et al. "Efficient Least-Squares 2-D-Cubic Spline for Concurrent Dual-Band Systems", IEEE Transactions on Microwave Theory and Techniques, vol. 63; No. 7, Jul. 2015; pp. 2199-2210.
Panigada, et al. "A 130 mW 100 MS/s Pipelined ADC with 69 SNDR Enabled by Digital Harmonic Distortion Correction," IEEE Journal of Solid-State Circuits; vol. 44; No. 12; Dec. 2009, pp. 3314-3328.
Peng, et al. "Digital Predistortion for Power Amplifier Based on Sparse Bayesian Learning", IEEE Transactions on Circuits and Systems, II: Express Briefs; 2015, pp. 1-5.
Quindroit et al. "FPGA Implementation of Orthogonal 2D Digital Predistortion System for Concurrent Dual-Band Power Amplifiers Based on Time-Division Multiplexing", IEEE Transactions on Microwave Theory and Techniques; vol. 61; No. 12, Dec. 2013, pp. 4591-4599.
Rawat, et al. "Adaptive Digital Predistortion of Wireless Power Amplifiers/Transmitters Using Dynamic Real-Valued Focused Time-Delay Line Neural Networks", IEEE Transactions on Microwave Theory and Techniques; vol. 58, No. 1; Jan. 1, 2010; pp. 95-104.
Safari, et al. "Spline-Based Model for Digital Predistortion of Wide-Band Signals for High Power Amplifier Linearization", IEEE; 2007, pp. 1441-1444.
Sevic, et al. "A Novel Envelope-Termination Load-Pull Method of ACPR Optimization of RF/Microwave Power Amplifiers," IEEE MTT-S International; vol. 2, Jun. 1998; pp. 723-726.
Tai, "Efficient Watt-Level Power Amplifiers in Deeply Scaled CMOS," Ph.D. Dissertation; Carnegie Mellon University; May 2011; 129 pages.
Tehran, et al. "Modeling of Long Term Memory Effects in RF Power Amplifiers with Dynamic Parameters", IEEE; 2012, pp. 1-3.
Yu et al. "A Generalized Model Based on Canonical Piecewise Linear Functions for Digital Predistortion", Proceedings of the Asia-Pacific Microwave Conference; 2016, pp. 1-4.
Yu, et al. "Band-Limited Volterra Series-Based Digital Predistortion for Wideband RF Power Amplifiers," IEEE Transactions of Microwave Theory and Techniques; vol. 60; No. 12; Dec. 2012, pp. 4198-4208.
Yu, et al."Digital Predistortion Using Adaptive Basis Functions", IEEE Transactions on Circuits and Systems-I. Regular Papers; vol. 60, No. 12; Dec. 2013, pp. 3317-3327.
Zhang et al. "Linearity Performance of Outphasing Power Amplifier Systems," Design of Linear Outphasing Power Amplifiers; Google e-book; 2003; Retrieved on Jun. 13, 2014; Retrieved from Internet <URL:http:www.artechhouse.com/uploads/public/documents/chapters/Zhang-LarsonCH- 2.pdf; pp. 35-85.
Zhu et al. "Digital Predistortion for Envelope-Tracking Power Amplifiers Using Decomposed Piecewise Volterra Sereis," IEEE Transactions on Microwave Theory and Techniques; vol. 56; No. 10; Oct. 2008; pp. 2237-2247.
Cidronali, A., I. Magrini, R. Fagotti, and G. Manes. "A new approach for concurrent dual-band IF digital predistortion: System design and analysis." In 2008 Workshop on Integrated Nonlinear Microwave and Millimetre-Wave Circuits, pp. 127-130. IEEE, 2008.
Henrie, Justin, Andrew Christianson, and William J. Chappell. "Cancellation of passive intermodulation distortion in microwave networks." In Microwave Conference, 2008. EuMC 2008. 38th European, pp. 1153-1156. IEEE, 2008.
Riihonen et al., "Mitigation of Loopback Self-Interference in Full-Duplex Mimo Relays" IEEE Transactions on Signal Processing, 59(12), 5983-5993, Dec. 2011.
International Search Report dated Sep. 21, 2018 in International Application No. PCT/US2018/041773.
Cheng, Sheng-Lung, Wen-Rong Wu, Chun-Hsien Peng, Chen-Jui Hsu, and Paul Liang. "Digital predistortion for concurrent dual-band transmitter using a 2D LUT based method." In 2015 IEEE 16th Annual Wireless and Microwave Technology Conference (WAMICON), pp. 1-4. IEEE, 2015.
R.N. Braithwaite, "Implementing crest factor reduction (CFR) by offsetting digital predistortion (DPD) coefficients," 2012 Workshop on Integrated Nonlinear Microwave and Millimetre-wave Circuits, Dublin, 2012, pp. 1-3, doi: 10.1109/INMMIC.2012.6331928. (Year: 2012).
Liu Youjiang et al.: Concurrent Dual-Band Digital Predistortion with a Single Feedback Loop:, IEEE Transactions on Microwave Theory and Techniques, Plenum, USA, vol. 63, No. 5, May 1, 2015 (May 1, 2015), pp. 1556-1568, XP011580127, ISSN: 0018-9480, DOI: 10.1109/TMTT.2015.2417158.

* cited by examiner

MONITORING SYSTEMS AND METHODS FOR RADIOS IMPLEMENTED WITH DIGITAL PREDISTORTION

CROSS-REFERENCE TO RELATED APPLICATIONS

This application is the national phase under 35 USC 371 of international application no. PCT/US2018/041773, filed Jul. 12, 2018, which claims the benefit of U.S. Provisional Application No. 62/531,646, filed Jul. 12, 2017, the contents of which are incorporated by reference.

BACKGROUND

The present disclosure relates to monitoring and diagnosis of radios in a communication system, implemented with digital predistortion.

Radios in wireless systems typically exhibit nonlinear characteristics. The largest contribution of nonlinear distortion comes from a radio's power amplifier as the power amplifier is driven to deliver maximum rated output power.

One way of compensating for the nonlinear characteristics of power amplifiers is to 'predistort' an input signal (e.g., by adding an 'inverse distortion' to the input signal) to compensate for the nonlinearity of the power amplifier before providing the input signal to the power amplifier. The resulting output of the power amplifier is a linear amplification of the input signal with reduced nonlinear distortion.

Power amplifiers with digital distortion are relatively inexpensive and power efficient. These properties make power amplifiers with digital predistortion attractive for use in telecommunication systems where amplifiers are required to inexpensively, efficiently, and accurately reproduce the signal present at their input.

SUMMARY

Radios deployed in wireless network (e.g., base stations compliant with 3GPP and other wireless standards) are equipped with monitoring schemes to ensure robust wireless networks.

Transmitters in radios typically have a power amplifier (forming part of a transmit chain) and adaptive digital front end (DFE). Such adaptive schemes can become unstable due to unexpected perturbations experienced by the system (e.g., an incorrect/invalid input signal type, an incorrect/invalid calibration, a power amplifier malfunction, an unexpected time delay in the system, an unexpected gain in the system, and so on).

The implementations described herein therefore ensure that the transmitter with an adaptive digital front end (DFE) of a radio in a wireless system is monitored reliably. This may include ensuring that a user interacting with the system has not provided invalid data (e.g., that input from the user regarding delay, phase, gain, and other system information over which the user has some control and can provide input, is correct). The implementations described herein are also configured to monitor and verify that data produced or relied upon by the amplifier system is valid (e.g., in order for the adaptation process to update DPD coefficients), to detect any breakdowns of the system during its operation (e.g., determine if there are any wild swings in attributes of incoming input signals), and so on. Detection of anomalous behavior by the amplifier system may be indicative of operational issues requiring corrective action (e.g., ensuring that data used for adaptation of various parameters controlling the operation of the system is valid, and optionally discarding data that can adversely affect adaptive functionality of the system).

Aspects described herein monitor and diagnose various parameters of a DFE system (and/or the broader system of which the DFE is a part of) to ensure that the system is functioning reliably and to identify potential problems in the system.

Some aspects generate alerts when potential problems arise. Some aspects attempt to mitigate potential problems. Some aspects both generate alerts and attempt to mitigate potential problems.

In some variations, a method for monitoring performance of a transmitter in a radio with an adjustable digital predistortion system is provided. The method includes determining a plurality of system characteristics, including determining one or more of, for example, data characterizing an input/output characteristic of a digital predistorter of the system, data characterizing a performance of a crest factor reduction process of the system, data characterizing a quality of a plurality of parameters associated with the digital predistorter, data characterizing an average time delay associated with the system, data characterizing an average gain associated with the system, and/or data characterizing a phase associated with the system. The method further includes comparing one or more of the plurality of system characteristics to respective one or more reference values, and controlling the adjustable digital predistortion system based on a result of the comparing.

Embodiments of the method may include at least some of the features described in the present disclosure, including one or more of the following features.

Determining the plurality of the system characteristics for the adjustable digital predistortion system of the transmitter may include determining at least one of the plurality of the system characteristics based on at least one output of a respective at least one infinite impulse response (IIR) filter configured to determine the at least one of the plurality of the system characteristics.

Controlling the adjustable digital predistortion system may include generating one or more diagnostic alerts based on the result of the comparing.

Determining the data characterizing the performance of the crest factor reduction process may include determining one or more of, for example, peak-to-average power ratio (PAPR) value computed as a squared value of a peak amplitude of a signal segment divided by a squared RMS value of the signal segment, and/or a number of peaks in the signal segment not processed through the crest factor reduction process.

Determining the data characterizing the input/output characteristic of the digital predistorter of the system may include deriving one or more error vector magnitude (EVM) values based on one or more of, for example, an input signal to the digital predistorter, an output signal to the digital predistorter, and/or coefficients controlling predistortion behavior of the digital predistorter.

Deriving the one or more EVM values may include deriving the one or more EVM values according to a computation of a ratio of a first average power of a difference between the input signal to the digital predistorter and the output signal of the digital predistorter, and a second average power of the input signal to the digital predistorter.

Deriving the one or more EVM values may include deriving the one or more EVM values representative of one or more comparisons of a measured output signal of the digital predistorter to an expected signal of the digital predistorter based on derived DPD coefficients for the digital predistorter.

Deriving the one or more EVM values may include computing an exponentially decaying average based on the derived one or more EVM values.

Controlling the adjustable digital predistortion system based on the result of the comparing may include adjusting the coefficients controlling the predistortion behavior of the digital predistorter in response to one or more of, for example, current DPD coefficients determined to be out-of-bound, or at least one of the one or more EVM values exceeding an EVM threshold.

Controlling the adjustable digital predistortion system based on the result of the comparing may include configuring the adjustable digital predistortion system to bypass the digital predistorter in response to a determination that an average output power of the system exceeds a power threshold.

Controlling the adjustable digital predistortion system based on the result of the comparing may include adjusting a delay parameter of the adjustable digital predistortion system based on real-time average of a cross product of synchronization data representative of synchronization behavior of an output of the adjustable digital predistortion system and another signal.

Controlling the adjustable digital predistortion system based on the result of the comparing may include determining whether a subset of the plurality of system characteristics are within respective normal ranges, and performing one of, for example, a) discarding signal samples directed to an adaptation module to adjust DPD coefficients controlling predistortion behavior of the digital predistorter upon a determination that at least part of the subset of the plurality of system characteristics corresponds to the signal samples is anomalous, b) providing the signal samples directed to the adaptation module when the subset of the plurality of system characteristics is determined to be within the normal ranges, c) disabling one or more modules of the adjustable digital predistortion system, or d) causing a restart of at least one module of the adjustable digital predistortion system configured to compute respective at least one system parameter for the adjustable digital predistortion system.

In some variations, a system to monitor a performance of a transmitter in a radio with an adjustable digital predistortion system is provided. The system includes the adjustable digital predistortion system, which includes a digital predistorter and a crest factor reduction unit operatively coupled to digital predistorter, and one or more monitoring sensors to determine respective one or more of system characteristics for the adjustable digital predistortion system, including one or more of, for example, a) data characterizing an input/output characteristic of the digital predistorter, b) data characterizing a performance of the crest factor reduction unit, c) data characterizing a quality of a plurality of parameters associated with the digital predistorter, d) data characterizing an average time delay associated with the adjustable digital predistortion system, e) data characterizing an average gain associated with the adjustable digital predistortion system, and f) data characterizing a phase associated with the adjustable digital predistortion system. The system further includes a controller operatively coupled to the adjustable digital predistortion system and the one or more monitoring sensors, with the controller configured to compare at least one of the one or more system characteristics to respective one or more reference values, and control the adjustable digital predistortion system based on a result of the comparing.

Embodiments of the system may include at least some of the features described in the present disclosure, including at least some of the features described above in relation to the method, as well as one or more of the following features.

At least one of the one or more monitoring sensors to determine the plurality of the system characteristics for the adjustable digital predistortion system may be configured to determine at least one of the plurality of the system characteristics based on at least one output of a respective at least one infinite impulse response (IIR) filter configured to determine the at least one of the plurality of the system characteristics.

The one or more monitoring sensors configured to determine the data characterizing the performance of the crest factor reduction unit include may include at least one monitoring sensor configured to determine one or more of, for example, peak-to-average power ratio (PAPR) value computed as a squared value of a peak amplitude of a signal segment divided by a squared RMS value of the signal segment, and/or a number of peaks in the signal segment not processed through the crest factor reduction unit.

The one or more monitoring sensors configured to determining the data characterizing the input/output characteristic of the digital predistorter of the system may include at least one monitoring sensor configured to derive one or more error vector magnitude (EVM) values based on one or more of, for example, an input signal to the digital predistorter, an output signal to the digital predistorter, and/or coefficients controlling predistortion behavior of the digital predistorter.

The at least one monitoring sensor configured to derive the one or more EVM values may be configured to derive the one or more EVM values according to a computation of a ratio of a first average power of a difference between the input signal to the digital predistorter and the output signal of the digital predistorter, and a second average power of the input signal to the digital predistorter.

The at least one monitoring sensor configured to derive the one or more EVM values may be configured to compute an exponentially decaying average based on the derived one or more EVM values.

The controller configured to control the adjustable digital predistortion system based on the result of the comparing may be configured to adjust DPD coefficients controlling predistortion behavior of the digital predistorter in response to one or more of, for example, current DPD coefficients determined to be out-of-bound, and/or at least one of the one or more EVM values exceeding an EVM threshold.

The controller configured to control the adjustable digital predistortion system based on the result of the comparing may be configured to configure the adjustable digital predistortion system to bypass the digital predistorter in response to a determination that an average output power of the system exceeds a power threshold.

In some variations, a monitoring system is provided that is configured to perform one or more of the method steps provided above.

In some variations, a design structure is provided that is encoded on a non-transitory machine-readable medium, with the design structure including elements that, when processed in a computer-aided design system, generate a machine-executable representation of one or more of the system modules described above, or the monitoring system described above.

In some variations, an integrated circuit definition dataset that, when processed in an integrated circuit manufacturing system, configures the integrated circuit manufacturing system to manufacture one or more of the system modules described above, or the monitoring system described above.

In some variations, a non-transitory computer readable media is provided that is programmed with a set of computer instructions executable on a processor that, when executed, cause the operations comprising the various method steps described above.

Embodiments of the monitoring system, the design structure, the integrated circuit definition dataset, and the computer-readable media may include at least some of the features described in the present disclosure, including at least some of the features described above in relation to the method and the system.

Other features and advantages of the invention are apparent from the following description, and from the claims.

BRIEF DESCRIPTION OF THE DRAWINGS

These and other aspects will now be described in detail with reference to the following drawings.

Like reference symbols in the various drawings indicate like elements.

DESCRIPTION

Figure 1:
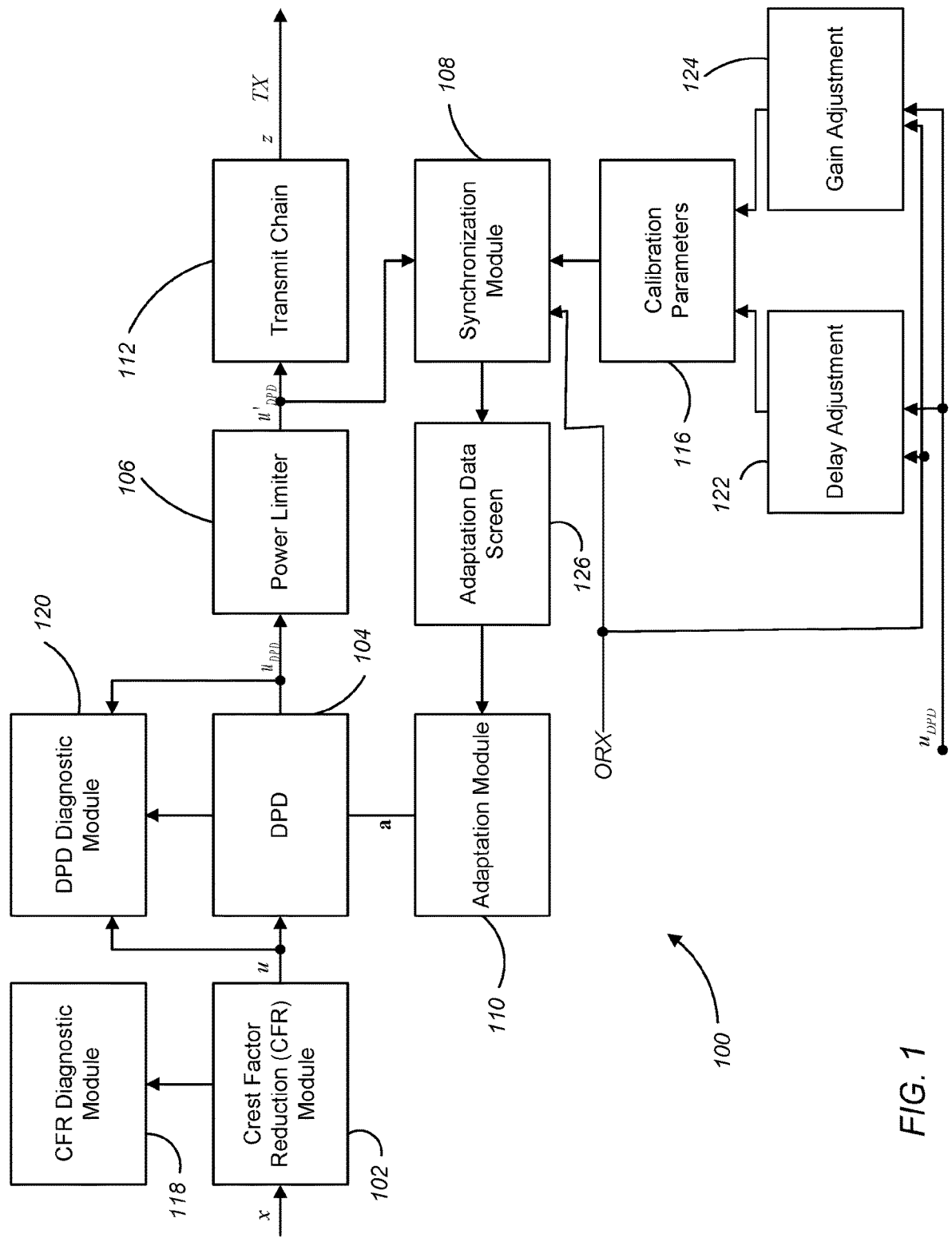
FIG. 1 is a schematic diagram of a transmitter of a radio comprising a digital front end with performance monitoring implementation.

Disclosed herein are methods, systems, devices, media, and other implementations for monitoring proper functioning of transmitters with an adjustable digital predistortion system (such as in an adaptive digital front end (DFE) of a radio). In some implementations, a method is provided that includes determining data that includes, for example: a) data characterizing an input/output characteristic of a digital predistorter of the system, b) data characterizing a performance of a crest factor reduction process of the system, c) data characterizing a quality of a plurality of parameters associated with the digital predistorter, d) data characterizing an average time delay associated with the system, e) data characterizing an average gain associated with the system, and/or f) data characterizing a phase associated with the system. In some embodiments, other types of health monitoring data (e.g., diagnostic data) may be obtained or determined, including, for example, data characterizing an average output power of the system (e.g., at the output of the digital predistorter, at the output of the transmitter chain, or elsewhere in the system). The method provided further includes comparing one or more of the plurality of system characteristics to respective one or more reference values, and controlling the adjustable digital predistortion system based on a result of the comparing. Alternatively, or additionally, controlling the adjustable predistortion system based on the result of the comparing may include adjusting filtering parameters (e.g., DPD coefficients) controlling filtering (e.g., predistortion) behavior of the digital predistorter in response to one or more of: current DPD coefficients determined to be out-of-bound (e.g., of some pre-defined range of filtering parameter values), an error vector magnitude (derived based on the input signal, output signal, and/or current DPD coefficient values) exceeding an EVM threshold, or based on some other metric comparison. In yet additional embodiments, controlling the adjustable digital predistortion system based on the result of the comparing may include determining whether a subset of the plurality of system characteristics are within normal ranges, and performing one of, for example: a) discarding signal samples directed to an adaptation module to adjust filtering parameters controlling filtering behavior of the digital predistorter upon a determination that at least part of the subset of the plurality of system characteristics corresponds to the signal samples is anomalous, b) providing the signal samples directed to the adaptation module when the subset of the plurality of system characteristics is determined to be within the normal ranges, c) disabling one or more modules of the adjustable digital predistortion system, or d) causing a restart of at least one module of the adjustable digital predistortion system configured to compute respective at least one system parameter for the adjustable digital predistortion power amplifier system.

In some implementations, a system configured to monitor a performance of an adjustable digital predistortion system, such as one included in an adaptive digital front end (DFE) system for transmitters in a radio, is provided. The system includes the transmitter with adaptive/adjustable DFE, which includes, inter alia, a power amplifier that may exhibit non-linear behavior for at least part of its operational range (e.g., as function of input voltage/current, input signal frequency, etc.), a digital predistorter (to predistort the input signal so that, when the resultant predistorted signal is provided as input to the power amplifier the non-linear effects would be offset, at least partly), and a crest factor reduction unit (to clip the peaks of the input signal so as to mitigate non-linear effects of the power amplifier resulting from high signal amplitudes) operatively coupled to digital predistorter. The system further includes one or more monitoring sensors to determine respective one or more of system characteristics for the adjustable digital predistortion power amplifier, including one or more of: a) data characterizing an input/output characteristic of the digital predistorter, b) data characterizing a performance of the crest factor reduction unit, c) data characterizing a quality of a plurality of parameters associated with the digital predistorter, d) data characterizing an average time delay between the transmitter and observation/feedback receiver paths, e) data characterizing an average gain associated with a transmitter and observation receiver loop, and f) data characterizing a phase associated with a transmitter and observation receiver loop. Optionally, in some embodiments other types of monitoring or diagnostic data may be obtained, including, for example, data characterizing an average output power of the transmitter, including the power amplifier. The system additionally includes a controller operatively coupled to the transmitter with the adjustable digital front end and the one or more monitoring sensors, with the controller configured to compare at least one of the one or more system characteristics to respective one or more reference values, and control the transmitter with adjustable digital front end based on a result of the comparing.

Thus, with reference to FIG. 1, a transmitter linearization system 100 (which may be part of a transmitter with a digital front end) with a performance monitoring implementation, is shown. The system 100 receives an input signal, x, and processes the input signal to generate a transmit signal, TX as an amplified version of the input signal, x. The linearization system, which is configured to compensate for non-linearity effects introduced by various modules/circuits of power amplification modules, includes a crest factor reduction module 102, a digital predistortion (DPD) module 104, a power limiter 106, a transmit chain 112 (which includes a power amplifier), and an adaptation module 110. As will be discussed in greater detail below, the system 100 includes performance monitors/sensors that are configured to measure the performance of the various units/modules comprising the linearization system and/or non-linear effects introduced by the power amplifier, and control adjustable parameters for at least some of these modules in order to control the behavior and performance of the system 100.

More particularly, the input signal, x, is first provided to the crest factor reduction (CFR) module 102 which reduces the Peak to Average Power Ratio (PAPR) of the input signal, x. The output of the CFR module 102, u is provided to the DPD module 104 which processes the CFR signal, u to generate an intermediate input signal, $u_{DPD}$. A variety of approaches may be used for CFR. One approach involves clipping the signal (a signal which may optionally have been upsampled, or pre-processed in some other way), followed by filtering the clipped signal to reduce distortion while meeting target error vector magnitude (EVM) and/or adjacent channel power ratio (ACLR) metrics. Because the filtering may itself introduce new amplitude peaks, this process may be repeated multiple times. In some such approaches, the level at which the signal is clipped may be reduced from stage to stage to progressively meet the target maximum amplitude relative to the RMS value. In another approach, the upsampled signal is clipped, and the amount by which this signal exceeds the clipping signal is filtered by a predefined filter or multiplied by a predefined time-domain window centered at a time location of the peak amplitude (i.e., so that is appropriately band limited), and subtracted from the signal. Again, in such an approach, the process may be repeated in several stages because the filtering or windowing may introduce new peak amplitudes beyond the limit.

Yet another approach to perform CFR processing is to identify locations of peak amplitude above a threshold in the input signal, and subtract scaled versions of a predefine pulse shape. This pulse shape may be designed so that it does not add substantial energy outside the permitted signal band. Because the subtracted pulse might not remove peak amplitudes at the point the pulse is added, this process may need to be repeated multiple times. In some implementations, the input signal may represent a combination of signals in two or more frequency limited bands that are separated in frequency with intervening bands. Some of the approaches described herein attempt to process baseband signals representing each of the limited frequency bands with the goal of limiting the amplitude of the combined signal.

The CFR module 102 may be realized as a software implementation (e.g., a processor-based device executing instructions that cause the processor-based device to facilitate the CFR processing), hardware (e.g., dedicated circuits, implemented on programmable arrays, application-specific integrated circuits), or a hybrid software-hardware implementation. The CFR module 102, which may be part of a network node or mobile device, may include a peak identification circuit (e.g., to identify a peak in an aggregate time-domain signal which may have been combined from one or more time-domain representations of received signals in one or more radio transmission bands), and a pulse subtraction circuit to perform, using respective pulse shapes for one or more pulses (such pulse shapes may have been determined, locally at the system 100 or remotely at a remote device in communication with the system 100, based on optimization of a plurality of updateable parameters to control pulse shapes), individual pulse subtraction processing for the respective one or more time-domain representations. The optimization of the plurality of updateable parameters may be based on an earlier performance of iterative updating of the plurality of updateable parameters according to an iterative evaluation of a plurality of performance parameters using, at least in part, pre-determined communication system data representative of characteristics of a communication system comprising the one or more radio transmission bands. Additional details and example of CFR processing approaches are provided in PCT application No. PCT/US2018/036691, entitled "CREST FACTOR REDUCTION," the content of which is hereby incorporated by reference in its entirety.

As further illustrated in FIG. 1, the transmitter linearization system 100 (e.g., of the digital front end system) may include an associated CFR monitor (also referred to as a CFR diagnostic module) 118 configured to perform, for example, a peak-to-average power ratio (PAPR) computation and/or to determine a number of peaks that are being missed by the CFR module 102. In some examples, the CFR diagnostic module 118 determines max code value as a maximal peak that the CFR module 102 has encountered. The metric PAPR may be defined as the peak amplitude squared (giving the peak power) divided by the RMS value squared (giving an average power). Other types of metrics that may be used to measure the performance of the CFR processing implemented by the CFR module 102. For example, various measures of distortion may characterize the effect of CFR processing. Such distortion measures include an error vector magnitude (EVM) metric, an adjacent channel power ratio (ACPR) (defined as a ratio between the total power in adjacent channels (e.g., an intermodulation signal) to the desired channel's power), etc.

If at least part of the information determined by the CFR diagnostic module 118 is anomalous, the module may cause generation of an alert, suspend operation of some modules of the system (e.g., suspend the DPD adaptation process to stop DPD coefficient from being updated due to the possibly anomalous data), and/or cause adjustment of at least some of the parameters (e.g., pulse shapes parameters, clipping parameters) to restore normal CFR performance metrics (e.g., a reduced number of peaks and/or reduced PAPR over some time interval). For example, some system characteristics or various parameters that were set to values that were intended to remain substantially static during normal operation of the CFR module may be allowed to be adjusted in response to anomalous behavior detected by the CFR diagnostic module 118. Examples of CFR-related system characteristics that generally remain static but may be changed in response to anomalies detected by the module 118 include, but are not limited to, pulse length, number of peak trackers, number of CRF stages, hard clipping factor(s), peak qualification window size, optimization criteria, etc. The updating of such generally static characteristics may be done together or separately with updating of generally variable adjustable parameters (including adaptable parameters that are directly computed based on an optimization procedure, or one or more of a number of pre-determined sets of parameters/coefficients selected based on system characteristics) that is generally performed by the CFR module 102.

The adjustment of adjustable parameters controlling the operation of the CFR module 102 (including generally variable parameters that may be adjusted periodically in response to changing system characteristics and/or generally static characteristics that may be adjusted in response to detection of anomalous behavior of the CFR module or of some other module of the system 100) may be done independently of measuring the performance of other modules/units of the system 100, or of the adjustment of the parameters controlling operations of such other modules/units. That is, to the extent that adjustment to the operation of the CFR module 102 are made to counter degradation in performance (as measured by the CFR monitor 118), performance measured by other diagnostic monitors of other circuits of the system 100, and/or adjustments to adjustable parameters controlling operations of such other circuits, might not be needed to be taken into account. Alternatively, in some embodiments, controllably adjusting the CFR adjustable parameters (e.g., to control clipping characteristics or pulse shape) may be based also on performance metrics derived by other performance monitors of other units and/or adjustment performed to those units' adjustable parameters (if any). A controller circuit to determine whether and how to adjust adjustable parameters of the CFR module 102 may be located at the CFR module 102, at the CFR monitor 118, or at some other controller circuit of the system 100 (where performance data for multiple circuits/modules of the system 100, and other control data, including data about any adjustment to parameters of one or more modules/circuits of the system, may be collected and processed).

In some implementations, to efficiently and expeditiously process performance data (e.g., in real-time or near-real-time), the CFR monitor may be realized through simple, fast-computation circuits, such as IIR filter circuits (e.g., 1-tap circuit, or multiple-tap circuit). Such fast-computation circuits may trade-off some accuracy in the determination of performance metrics by the CFR module 102 for speed in deriving the performance metric. Thus, in such embodiments, the derived performance metric (e.g., PAPR) may be an approximation of the actual PAPR corresponding to the performance of the CFR module 102. In some situations, the approximation derived by relatively simple circuits (be it a 1-tap IIR circuit, or some other circuit type) may be sufficient in view of the aggregate effect that other modules/circuits of the system 100 have on the overall operation and performance of the system (which may, in any event, lead to a decrease in the accuracy of the performance measurements), and the need to regularly adapt the operation of the various modules/circuits constituting the system 100.

With continued reference to FIG. 1, the system 100 further includes the transmit chain 112, which includes a power amplifier (not specifically illustrated in FIG. 1), and which exhibits a nonlinear input/output power characteristic due to non-linearity effects of the power amplifier and other nonlinear components. In some embodiments, and as will be discussed in greater detail below, the transmit chain may receive its input from a power limiter 106 configured to ensure that the system 100 does not output excessive power that could potentially cause damage to downstream components.

When an intermediate input signal, $U_{DPD}$, is provided to the transmit chain 112 (in the example embodiments of FIG. 1, a power limited signal $u'_{DPD}$ is shown as the output of the power limiter 106 and the input to the transmit chain, but in other example, embodiments, the power limiter 106 might not be included, in which case the signal $u_{DPD}$, which is the output of a DPD 104, would be the same as the signal $u'_{DPD}$), the transmit chain 112 generates an output signal, z as an amplified version of the intermediate input signal, $u_{DPD}$. In general, the output signal, z includes nonlinear distortion due to the nonlinear input/output power characteristic of the transmit chain 106.

Without compensation from the DPD module 104, the output signal, z would not be an accurate amplified reproduction of the CFR signal, u. The system 100 therefore includes the DPD 104 to compensate for the nonlinear distortion introduced by the transmit chain 112. In particular, the DPD 104 "predistorts" the CFR signal, u to generate the intermediate input signal, $u_{DPD}$. (which results in a resultant signal $u'_{DPD}$ if the output of the DPD 104 is processed by a power limiter or some other processing module upstream of the transmit chain 112). Ideally, the intermediate input signal, $u_{DPD}$ includes an "inverse nonlinear distortion" (i.e., an inverse of the nonlinear distortion introduced by the transmit chain 112), such that the nonlinear distortion introduced by the transmit chain 112 is substantially cancelled by the inverse nonlinear distortion. The output signal, z of the transmit chain 112 is therefore substantially free of nonlinear distortion.

In general, the nonlinear input/output characteristic of the transmit chain 112 may change over time. The adaptation module 110 therefore periodically updates a set of parameters, a, used by the DPD 104 to generate the intermediate input signal, $u_{DPD}$ to reflect the changes in the nonlinear input/output characteristic of the transmit chain 112.

Figure 2:
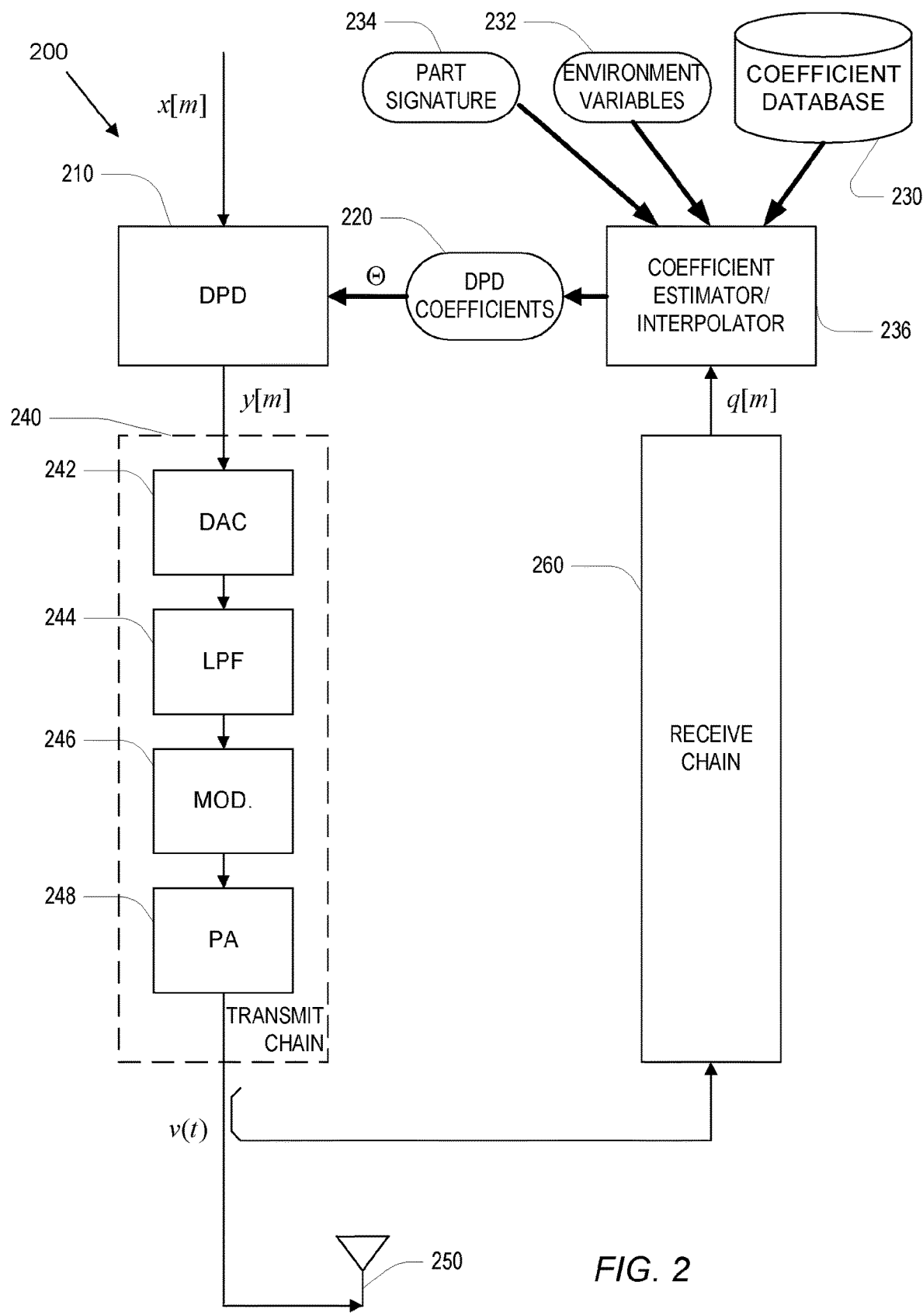
FIG. 2 is a block diagram of a transmitter chain with an observation receiver and adaptive digital predistortion.

One example of an implementation to update parameters is provided with reference to FIG. 2, which includes a block diagram of an adjustable pre-distorting power amplifier system 200, which may be similar to, or include, the portion of the system 100 comprising the DPD 104, the transmit chain 112, and the adaptation module 110 of the system 100 of FIG. 1. In the example system 200, a digital input signal x[m] at a baseband or intermediate frequency is passed through a Digital Pre-Distorter (DPD) 210 (which may be similar, in implementation or functionality, to the DPD 104) to produce a "pre-distorted" input y[m], which is passed through a transmit chain 240 to produce a driving signal v(t) that drives an antenna 250. The transmit chain may include a Digital-to-Analog Converter (DAC) 242, an analog low-pass filter (LPF) 244, and a modulator 246 (e.g., multiplication by a local oscillator) of the output of the LPF 244. The output of the modulator is passed to a power amplifier (PA) 248. The PA 248, as well as other elements in the transmit chain, may introduce non-linearities, which may be manifested in the driving signal v(t) as harmonic and/or inter-modulation distortion of the input signal x[m]. As noted, to overcome or mitigate these non-linearities, the DPD 210 introduces non-linearities that are intended to "pre-invert" (i.e. pre-distort) the non-linear effects of the transmit chain. In some examples, the DPD performs the transformation of the desired signal x[m] to the input y[m] of the transmit chain by using delay elements (not shown) to form a set of delayed versions of the desired signal, and then using a non-linear polynomial function of those delayed inputs. In some examples, the non-linear function is a Volterra series:

$$y[n]=h_0+\Sigma_p \Sigma_{\tau_1,\ldots,\tau_p} h_p(\tau_1,\ldots,\tau_p) \Pi_{j=1\ldots p} x[n-\tau_j]$$

In some examples, the non-linear function is a reduced set of Volterra terms, for example a delay polynomial:

$$y[n]=h_0+\Sigma_p \Sigma_\tau h_p(\tau) x[n-\tau] |x[n-\tau|^{(p-1)}$$

In some embodiments, to invert the non-linear effects of the transmit chain, a relatively large number of terms of such a series representation may be needed, and the coefficients of those terms (e.g., $h_p$ terms) need to be accurately set. The coefficients in such approaches may be continually updated to maintain good linearization. Approaches to such continual updating may include, for example, incremental updates using y[m] (the output of DPD 210), and/or observation of v(t) and other system characteristics.

With continued reference to FIG. 2, the DPD 210 may be controlled using a controller to determine/compute DPD coefficients (shown as DPD coefficients Θ 220) to adjust the DPD 210 using such determined DPD coefficients. In some embodiments, the DPD coefficients Θ 220 are determined using a database of coefficients 230, and values that essentially characterize the operation "regime" (i.e., a class of physical conditions) of the transmit chain, and/or of other system components (including remote load components and load conditions). These values (e.g., quantitative or categorical digital variables) include environment variables 232 (e.g., temperature, transmitter power level, supply voltage, frequency band) and/or a part "signature" 234, which represents substantially invariant characteristics, and which may be unique to the electronic parts of the transmit chain 240. In some embodiments, a load metric may be measured or derived based on measured system characteristics. In some embodiments, a load condition value, characterized or represented by a load metric (such as the VSWR value, or some other value) may be derived from locally determined system characteristics, including the input signal power to the power amplifier 248, the output signal power of the power amplifier 248 (which may be determined using, for example, a power detector), and the bias current of the power amplifier 248.

Determined system characteristic values or attributes may be provided to a coefficient estimator/interpolator 236 (e.g., via a feedback receive chain 260). The determined characteristics and metrics may be used to estimate/derive appropriate DPD coefficients. For example, the DPD coefficient sets may be computed so as to achieve some desired associated distortion measures/metrics that characterize the effects of the preprocessing, including an error vector magnitude (EVM), the adjacent channel power ratio (ACPR), or other types of distortion measures/metrics.

The coefficient interpolator 236 uses the various inputs it receives to access the coefficient database 232 and determine and output the corresponding DPD coefficients 220. A variety of approaches may be implemented by the coefficient estimator/interpolator 236, including selection and/or interpolation of coefficient values in the database according to the inputs, and/or applying a mathematical mapping of the input represented by values in the coefficient database. For example, in some embodiments, the estimator/interpolator 236 may be configured to select, from a plurality of sets of DPD coefficients (in the database 232), a DPD coefficient set associated with one or more pre-determined system characteristics or some metric derived therefrom. In some embodiments, the DPD coefficients used to control/adjust the DPD 210 may be determined by selecting two or more sets of DPD coefficients from a plurality of sets of DPD coefficients (maintained in the database 232) based on the system characteristics. An interpolated set of DPD coefficients may then be determined from the selected two or more sets of DPD coefficients. Further details regarding the determination of DPD coefficients (e.g., using a DPD coefficient database) are provided in U.S. Pat. No. 9,590,668, entitled "Digital Compensator," the content of which is hereby incorporated by reference in its entirety.

Another example of a technique for updating the DPD parameters/coefficients (which may be denoted as 'a') can be found in U.S. patent application Ser. No. 16/004,594, titled "LINEARIZATION SYSTEM," which is incorporated herein by reference in its entirety. Briefly, output signal, $u_{DPD}$ (or $u'_{DPD}$ if there is a power limiter positioned between the DPD 104 and the transmit chain 112), which is provided as input to the transmit chain 112, includes an "inverse nonlinear distortion" (i.e., an inverse of the nonlinear distortion introduced by the transmit chain 112) such that the nonlinear distortion introduced by the transmit chain 112 is substantially cancelled by the inverse nonlinear distortion. The output signal, z is therefore substantially free of nonlinear distortion.

In some examples, a DPD (such as the DPD 104) operates according to an inverse model of the nonlinear distortion of the transmit chain (e.g., the transmit chain 112 of FIG. 1) such that providing the input signal, u, to the DPD causes the DPD/actuator to generate the intermediate input signal, $u_{DPD}$ as follows:

$$u_{DPD} = 2u + \sum_{i=1}^{n} a_i f_i(u)$$

where $f_i(\cdot)$ is the $i^{th}$ basis function of n basis functions and $a_i$ is the $i^{th}$ parameter (e.g., the $i^{th}$ weight) corresponding to the $i^{th}$ basis function. Each basis function is a linear function (e.g., u(t−1)) or a non-linear function (e.g., $|u(t)|^2$) of the input, u, which may include memory (e.g., u(t)*u(t−1)).

Briefly, to update the parameters, a, used by the DPD 104 of FIG. 1, a predictor module (which may be implemented using the adaptation module 110) processes the intermediate input signal to the transmit chain 112 (i.e., the signal $u_{DPD}$), and a sensed version (e.g., a signal b) of the output signal z of the transmit chain (or some other output module that is downstream of the transmit chain) to generate an updated set of parameters, a'. In one example, the predictor module determines an updated set of parameters a' that, in combination with the basis functions and the intermediate input signal, $u_{DPD}$, generate a predicted signal that is as close as possible to the sensed signal, b (e.g., in a least mean squared error sense). This can be restated as:

$$P(u_{PDP}) = \sum_{i=1}^{n} \alpha_i f_i(u_{DPD})$$

The predictor, P, may be provided to a DPD update module (which may be part of the adaptation module 110) which processes the predictor P to update the DPD 104. In some examples, for the predictor P described above, the DPD update module configures the DPD 104 to perform according to an approximate inverse of the predictor P as follows:

$$DPD(u) = P^{-1}(u) \approx 2u - \sum_{i=1}^{n} \alpha_i f_i(u)$$

or by explicitly setting the DPD parameters as: $a_i = -\alpha_i$.

In another example, the predictor module may be configured to determine an updated set of parameters $\hat{\alpha}$ that, in combination with the basis functions and the sensed signal, b, generate a predicted signal, $\hat{u}_{DPD}$ that is as close as possible to the intermediate input signal, $u_{DPD}$ (e.g., in a least mean squared error sense). This can be restated as:

$$P(b) = \sum_{i=1}^{n} \alpha_i f_i(b).$$

That is, in such embodiments, P is an estimate of a (post) inverse of the nonlinearity of the transmit chain 112. The predictor P is provided to the DPD update which processes the predictor, P to update the DPD 104. In some examples, for the predictor P described immediately above, the DPD update module configures the DPD 104 to perform according to the predictor P as follows:

$$DPD(u) = P(b) = \sum_{i=1}^{n} \alpha_i f_i(b)$$

or essentially $a_i' = \alpha_i$.

Instead of deriving updated parameters, a', that cause the sense value, b, to be as close as possible to the intermediate signal $u_{DPD}$, in another example, updating of the DPD parameters may be implemented to generate an updated set of parameters, a', that, in combination with the basis functions, represent a difference between the model of the nonlinear input/output characteristic of the transmit chain 112 currently being used by the DPD 104 and the current nonlinear input/output characteristic of the transmit chain 112. In one example, the predictor module determines parameters α that, in combination with the basis functions and the input signal, u, to the DPD (rather than using the intermediate signal $u_{DPD}$) generate a predicted signal, b̂ that is as close as possible to the sensed signal, b (e.g., in a least mean squared error sense), which can be restated as:

$$P(u) = \sum_{i=1}^{n} \alpha_i f_i(u).$$

The parameters, α in combination with the basis functions represent the difference between the model of the nonlinear input/output characteristic of the transmit chain (e.g., the transmit chain 112) currently being used by the DPD (e.g., DPD 104) and the current nonlinear input/output characteristic of the transmit chain because the effects both the DPD and the transmit chain on the input signal, u, are represented in the sensed signal, b. An output of the predictor module, i.e., P, is provided to a DPD update module which processes the predictor P to update the DPD 104. In some examples, for the predictor P the DPD update module configures the DPD to combine an approximate inverse of the predictor with the existing DPD according to $a_i' \leftarrow a_i + \alpha_i$. This essentially approximates a cascade of the approximate inverse of the predictor, $P^{-1}$, with the previous DPD configuration to yield the new DPD configuration.

In another example, the predictor module determines a set of parameters α that, in combination with the basis functions and the sensed signal, b generate a predicted signal, û that is as close as possible to the input signal, u (e.g., in a least mean squared error sense), which can be restated as:

$$P(b) = \sum_{i=1}^{n} \alpha_i f_i(b).$$

Turning back to FIG. 1, coupled to DPD 104 is a DPD monitor (also referred to as a DPD diagnostic module) 120. In general, the nonlinearity of the transmit chain 112 is expected to be small, so the DPD module 104 is expected to make changes to the output signals, u, of the CFR module that are small relative to the signal itself. The DPD diagnostic module 120 may be configured to monitor the resultant CFR signal, u, the intermediate input signal, $u_{DPD}$, and the DPD parameters, a, to determine if any of those values, taken alone or in combination, are anomalous.

In some examples, the DPD diagnostic module 120 measures the error vector magnitude (EVM) of the DPD module 104 to determine the extent of deviation of the output signal from the input signal. The derived EVM value may be compared to a reference value (EVM threshold), and corrective action (e.g., re-commence computation of DPD parameters, issue an alert notice, temporarily suspend operation of the DPD, or some other appropriate remedy) may be initiated by the system 100 based on that comparison. The DPD EVM may be measured according to, for example, avg_power($u-u_{DPD}$)/avg_power(u), or some representative metric therefrom, e.g., the EVM may be expressed as a percentage according to a formulation of:

$$EVM(\%) = \sqrt{\frac{u - u_{DPD}}{u}} \times 100\%.$$

In some embodiments, the DPD diagnostic module 120 may be configured to determine if the deviation between the input signal, u, and the output signal of the DPD module, $u_{DPD}$, (or, in some embodiments, of the output signal, $u'_{DPD}$ of the power limiter 106) is the result of a malfunction (or some other problem) in the operation of the DPD module, or is just reflective of the filtering performed by the current DPD parameters/coefficients on the input signal, u. Thus, in such embodiments, the DPD diagnostic module 120 may be configured to derive the one or more EVM values representative of one or more comparisons of a measured output signal of the digital predistorter to an expected signal resulting from filtering applied to the input signal to the digital predistorter using the filtering parameters.

In some examples, an average (e.g., an exponentially decaying average) of the EVM over time may be used. Additionally, computation of the EVM may be based on an pre-determined and/or adjustable number of samples (e.g., $2^9, 2^{10}, 2^{11}, 2^{12}$, etc.) In some examples, a hardware-efficient average power calculation may be used to determine the average EVM (e.g., a 1-tap IIR filter to approximate the chunk averaging function, resulting in faster identification time and less hardware resources), or to determine other DPD-related measurements. As noted, because of the interplay between the various modules of the system 100, which may anyway reduce the degree of confidence or certainty associated with measurements obtained by any one of the diagnostic modules of the system 100, an approximation of DPD diagnostic measurements (e.g., DPD EVM) provided by a cruder, but faster, hardware-based filter implementation may be sufficient.

In some implementations, the DPD diagnostic module 120 evaluates the DPD parameters, a, to ensure that they do not exceed a threshold boundary and are meaningful. In some examples, if the EVM exceeds a threshold (e.g., 40%), or if the DPD parameters are out of bounds, the system issues an alert to a user or a remote system (which in turn may take some corrective action). In some examples, the alert causes the adaptation process performed by the adaptation module 110 to restart/reset (e.g., re-starting a DPD parameter determination process that is based on use of system characteristics to select and/or extrapolate parameters values from pre-determined parameter sets, or re-starting a DPD parameter determination process that updates the DPD parameters to optimize them based on the sensed output, b, of the transmit chain, and either the signal u or $u_{DPD}$ of the system 100). As with adjustment of CFR-related characteristics and/or parameters, control of the DPD module 104 and/or the adaption module 110 (including the adjustment of DPD-related characteristics and/or DPD parameters) may be done independently of performance of other modules of the system 100 and/or independently of adjustment of the parameters controlling operations of such other modules/units. To the extent that adjustments to the operation of the DPD 104 and/or the adaptation module 110 are made to counter degradation in performance (as measured by the DPD diagnostic module 120 or some other DPD-related diagnostic module, such as the adaptation data screen 126), performance measured by other diagnostic monitors of other modules/units of the system 100, and/or adjustments to adjustable parameters controlling operations of such other circuits, may not need to be taken into account. Alternatively, in some embodiments, controlling the DPD operations may be based also on performance metrics derived by other performance monitors of other modules/units and/or adjustment performed on those units' adjustable parameters (if any).

As further depicted in FIG. 1, in addition to the CFR diagnostic module 118 and the DPD diagnostic module 120, the power amplifier linearization system 100 may include one or more additional performance monitors (i.e., diagnostic modules) for monitoring system performance and for addressing system anomalies that may arise. For example, and as noted above, the system 100 may further include the power limiter 106. The system 100 may further include, in some implementations, a synchronization module 108, a delay adjustment module 122, a gain adjustment module 124, and an adaptation data screen module 126. While not illustrated in FIG. 1, in some examples, the system 100 performs an input signal check to verify that the expected input signal is being received. For example, if the input signal is expected to be a 20 MHz signal in a particular band, the system 100 checks the particular band to ensure that a signal is present in the band. In some embodiments, the input signal check module may determine whether the input signal conforms to some pre-determined spectrum mask (e.g., if the frequency-domain representation of the signal is contained within some pre-determined frequency envelope or mask).

As discussed above, the power limiter 106 is configured to process the intermediate DPD signal, $u_{DPD}$, in such a way that the system 100 does not output excessive power that could potentially cause damage to downstream components. In some examples, the power limiter 106 limits the maximal average power and/or peak power of the digital signal, $u_{DPD}$. In some examples, the power limiter 106 calculates an average power of the signal u and/or the signal $u_{DPD}$ (and optionally of the signal x), and bypasses the DPD 104 if the average power exceeds a threshold. As with some of the other diagnostic module, the power limiter 106 may also be implemented using a hardware-efficient average power calculation such as a 1-tap IIR filter (or, alternatively, a multi-tap filter) to approximate a conventional chunk averaging function. In some examples, the power limiter 106 limits the DPD peak output. In some examples, if the average power exceeds a threshold, the power limiter 106 causes the system to generate an alert. Here too, the derivation of diagnostic measurements may be based on a pre-determined and/or adjustable number of samples (e.g., $2^9$, $2^{10}$, $2^{11}$, $2^{12}$, etc.)

In some embodiments, the intermediate signal $u_{DPD}$ (or optionally $u'_{DPD}$, or alternatively an observed sample of the output signal z of the transmit chain) is also provided to the synchronization module 108 (e.g., configured to synchronize or correlate the signals used for the adaptation processes) according to calibration parameters 116 that may include a time delay and phase parameters (which may correspond to time and phase differences between the observed output signal and the input signal) and a gain parameter. The calibration parameters 116 may be time-varying. The delay adjustment module 122 and the gain adjustment module 124 track the time varying system delay and the time varying system gain, respectively, and update the calibration parameters 116 accordingly. In some examples, the delay adjustment module 122 is configured to track the delay value based on a real-time averaging scheme. Such a real-time averaging scheme may be based on a hardware-efficient cross correlation calculation based on TX_sync and ORX_sync signals (e.g., using a 1-tap IIR filter to approximate a conventional chunk correlation function, resulting in faster identification time and less hardware resources), where TX_sync and ORX_sync are synchronized versions of $u_{DPD}$ and ORX. The gain adjustment module 124 is configured to track the gain based on a real-time power averaging scheme. Here too, the real-time power averaging scheme may be based on a hardware-efficient power averaging computation (e.g., using a 1-tap IIR filter to approximate a conventional chunk correlation function, resulting in faster identification time and less hardware resources). The computation of the values being tracked (e.g., by hardware efficient IIR filters, or otherwise) may be based on a pre-determined and/or adjustable number of samples (e.g., $2^9$, $2^{10}$, $2^{11}$, $2^{12}$, or any other number (smaller or larger) of samples). If the synchronization module 108 detects anomalous delay or gain values, the module 108 may cause the system 100 to generate an alert, or to take some other corrective action (e.g., re-compute adjustable system parameters, suspend or disable operation of one or more of the system modules, etc.)

As noted, the system 100 may also include the adaptation data screen module 126, which is configured to sanitizes data samples that are provided to the adaptation module based on an analysis of a number of parameters of the system 100 (e.g., a TX level check, a system delay, a system gain, and so on). If the adaptation data screen module 126 determines that the data checked is anomalous, it can disable the adaptation module 110 (e.g., through an Adapt_Enable signal actuatable/controllable by the adaptation data screen 126), thus resulting in the DPD coefficients, at least temporarily, not being updated. In some embodiments, in response to detection of anomalous sample or behavior, the adaptation data screen 126 may cause another type of corrective action, such as causing a restart of one or more adaptation process (e.g., the DPD adaptation process performed by the adaptation module 110) through, for example, actuation of a control reset signal. Under these circumstances, the system may continue to update some other adjustable parameters affecting performance of the system 100 (e.g., allowing any adjustable CFR parameters to continue being updated in response to diagnostic measurements from the CFR diagnostic module 118), which may allow the system to gradually stabilize and produce more normal results. In other examples, the adaptation data screen module 126 can simply discard data that is anomalous prior to it being provided, for example, to the adaptation module 110. As illustrated in the example of FIG. 1, the adaptation data screen may also be configured to disable other modules, including the delay adjustment module 122 and/or the gain adjustment module 124, in response to a determination by the adaptation data screen 126 that the data samples (and/or other attributes monitored by the data adaptation screen 126) are anomalous. Disabling of the various modules controlled by the adaptation data screen 126 may be performed, for example, through control of an enabling signal (such as the 'PA_enable') actuatable by the adaptation data screen 126.

In some examples, a TX level check is performed to ensure that the TX samples into the adaptation are below a pre-determined threshold ('maxin') defined for the DPD design. If the TX samples exceed the 'maxin' the samples are not provided to the adaptation module 110. The TX level check may also determine if the TX_sync is below a pre-defined threshold (i.e., determine whether |TX_sync|<threshold. In response to a determination that |TX_sync| is above the pre-determined threshold, the data pair TX_sync and ORX_sync is rejected and not used for adaptation processes (e.g., the DPD adaptation performed by the adaptation module 110).

As discussed in relation to the CFR module 120 and the DPD 104, controlling the operations of the various modules of the system 100 and/or obtaining diagnostic measurements for various modules/units of the system 100 may be performed so as to take into account performance diagnostics and behaviors by some or all of the modules/units of the system 100. In such embodiments, a global or central controller may be used to control the diagnostic and behavior-control operations of the system 100 (such a central controller may be one of the individual controller circuits of the system 100, with such a central controller configured to receive measurement data and control signals from the various modules/units of the system 100). Alternatively, each module may be controlled and/or diagnosed independently.

Figure 3:
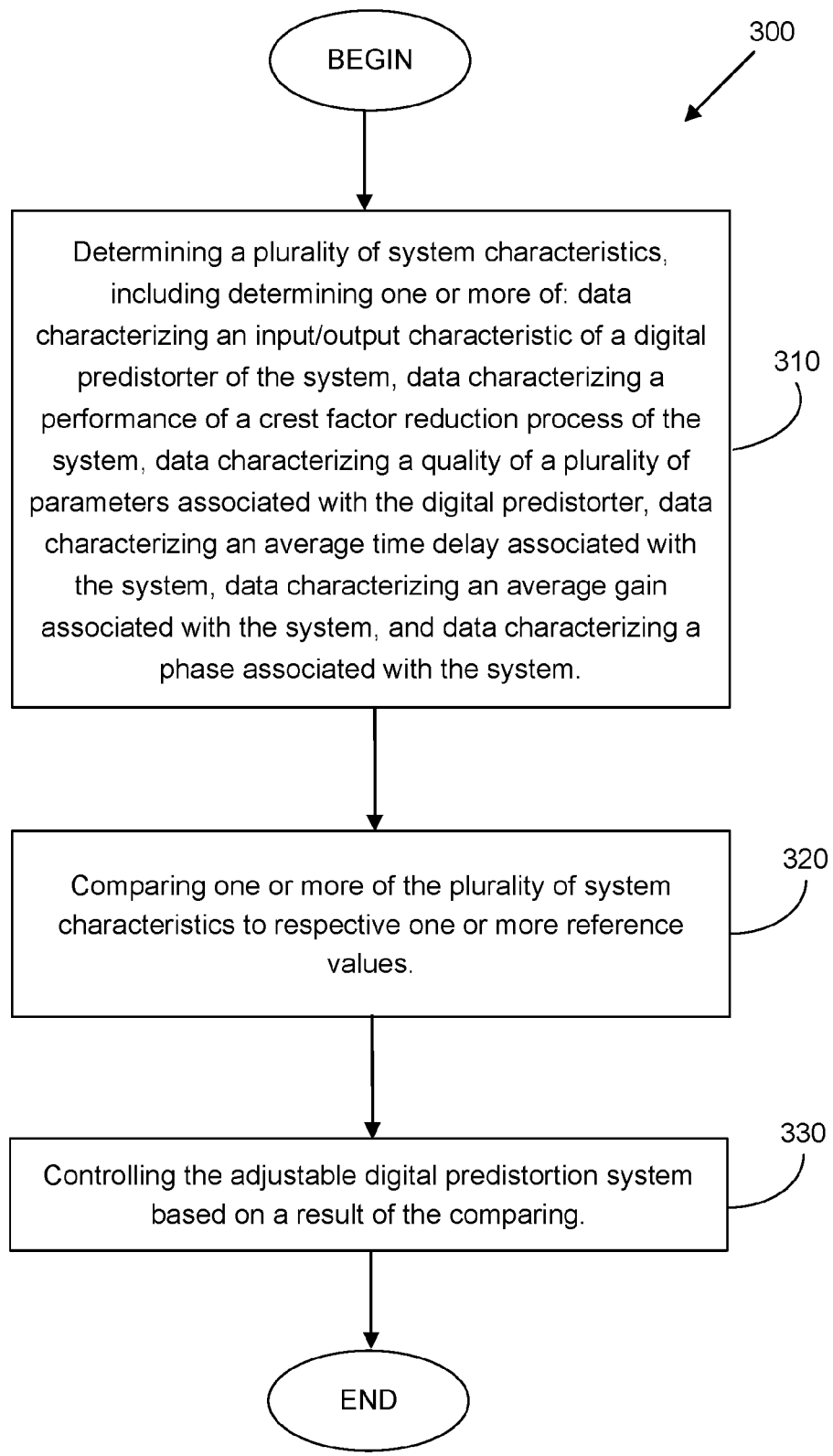
FIG. 3 is a flowchart of an example procedure to monitor proper functioning of DFE (digital front end) in a transmitter of a radio.

With reference now to FIG. 3, a flowchart of an example procedure 300 to monitor a performance of a transmitter with an adjustable digital front end (such as the system 100 of FIG. 1) is shown. The procedure 300 includes determining 310 a plurality of system characteristics. The determination of the plurality of characteristics includes determining one or more of, for example, a) data characterizing an input/output characteristic of a digital predistorter of the system, b) data characterizing a performance of a crest factor reduction process of the system, c) data characterizing a quality of a plurality of parameters associated with the digital predistorter, d) data characterizing an average time delay associated with the system, e) data characterizing an average gain associated with the system, and/or f) data characterizing a phase associated with the system. Other types of data representative of system characteristics may be used, including, for example data characterizing an average output power of the system.

In some embodiments, determining the data characterizing the performance of the crest factor reduction process (e.g., implemented by a CFR module such as the module 102 of FIG. 1) may include determining (e.g., by a CFR monitor such as the CFR diagnostic module 118) one or more of, for example, peak-to-average power ratio (PAPR) value computed as a squared value of a peak amplitude of a signal segment divided by a squared RMS value of the signal segment, and/or a number of peaks in the signal segment not processed through the crest factor reduction process.

In some implementations, determining the data characterizing the input/output characteristic of the digital predistorter (such as the DPD 104 of FIG. 1, which uses adjustable/updateable parameters to pre-distort the input signal u that is fed to the transmit chain) may include deriving one or more error vector magnitude (EVM) values based on one or more of, for example, an input signal to the digital predistorter, an output signal to the digital predistorter, and/or or filtering parameters (e.g., DPD coefficients) controlling filtering (e.g., predistortion) behavior of the digital predistorter. For example, deriving the one or more EVM values may include deriving the one or more EVM values according to a computation of a ratio of a first average power of a difference between the input signal to the digital predistorter and the output signal of the digital predistorter, and a second average power of the input signal to the digital predistorter (e.g., the EVM may be derived based on $(u-u_{DPD})$ and u, such as $\text{avg\_power}(u-u_{DPD})/\text{avg\_power}(u)$). Deriving the one or more EVM values may include deriving the one or more EVM values representative of one or more comparisons of a measured output signal of the digital predistorter to an expected signal of the digital predistorter (e.g., deviation of the actual output of the DPD module from the expected output of the DPD, as determined based on the input to the DPD module and the current DPD coefficients, may be indicative of a more serious malfunction with the DPD module). In another example, deriving the one or more EVM values may include computing an exponentially decaying average based on the derived one or more EVM values.

As discussed herein, in some embodiments, to achieve a fast and simplified implementation of the computation performed by a system such as the system 100, IIR filter implementations (e.g., 1-tap IIR filters) may be used. Such IIR filters may achieve reasonable estimates of the various monitoring computations performed (e.g., averaging computations, cross-product computations, and so on), at faster computation time than can be achieved through more rigorous monitoring computation processing. Thus, in such embodiments, determining the plurality of the system characteristics for the transmitter with an adjustable digital front end system may include determining at least one of the plurality of the system characteristics based on at least one output of a respective at least one infinite impulse response (IIR) filter configured to determine the at least one of the plurality of the system characteristics.

With continued reference to FIG. 3, the procedure 300 further includes comparing 320 one or more of the plurality of system characteristics (determined at 310) to respective one or more reference values. The procedure 300 additionally includes controlling 330 the adjustable digital predistortion system based on a result of the comparing. In some embodiments, controlling the transmitter with an adjustable digital predistortion system may include generating one or more diagnostic alerts based on the result of the comparing (e.g., to alert a user, such as an administrator, of anomalous results, and possible causes/sources of the problems). In the example of the DPD module (e.g., the module 104 of FIG. 1), controlling the transmitter with an adjustable digital predistortion system based on the result of the comparing may include adjusting the filtering parameters controlling filtering behavior of the digital predistorter in response to one or more of, for example, current filtering parameters (e.g., current DPD coefficient) determined to be out-of-bound, or at least one of the one or more EVM values exceeding an EVM threshold.

In some implementations, controlling the transmitter with an adjustable digital predistortion system based on the result of the comparing may include configuring (e.g., using the power limiter 106 of FIG. 1) the adjustable digital predistortion system to bypass the digital predistorter in response to a determination that an average output power of the system exceeds a power threshold. In some examples, controlling the adjustable digital predistortion system based on the result of the comparing may include adjusting a delay parameter of the adjustable digital predistortion system based on real-time average of a cross product of synchronization data representative of synchronization behavior of an output of the adjustable digital predistortion system and another signal.

In another example, controlling the adjustable digital predistortion system based on the result of the comparing may include determining whether a subset of the plurality of system characteristics are within normal ranges (e.g., output samples that may be used for a DPD adaptation process are out of some pre-determined bound). In such embodiments, the controlling may also include performing (e.g., by the adaptation data screen 126 of FIG. 1) one or more of: discarding signal samples directed to an adaptation module (e.g., the adaptation module 110) to adjust filtering parameters controlling filtering behavior of the digital predistorter upon a determination that at least part of the subset of the plurality of system characteristics corresponds to the signal samples is anomalous, providing the signal samples directed to the adaptation module when the subset of the plurality of system characteristics is determined to be within the normal ranges, disabling one or more modules (e.g., the adaptation module 110, the delay adjustment module 122, and/or the gain adjustment module 124 of FIG. 1) of the adjustable digital predistortion system, or causing a restart of at least one module of the adjustable digital predistortion configured to compute respective at least one system parameter for the adjustable digital predistortion system.

Figure 4:
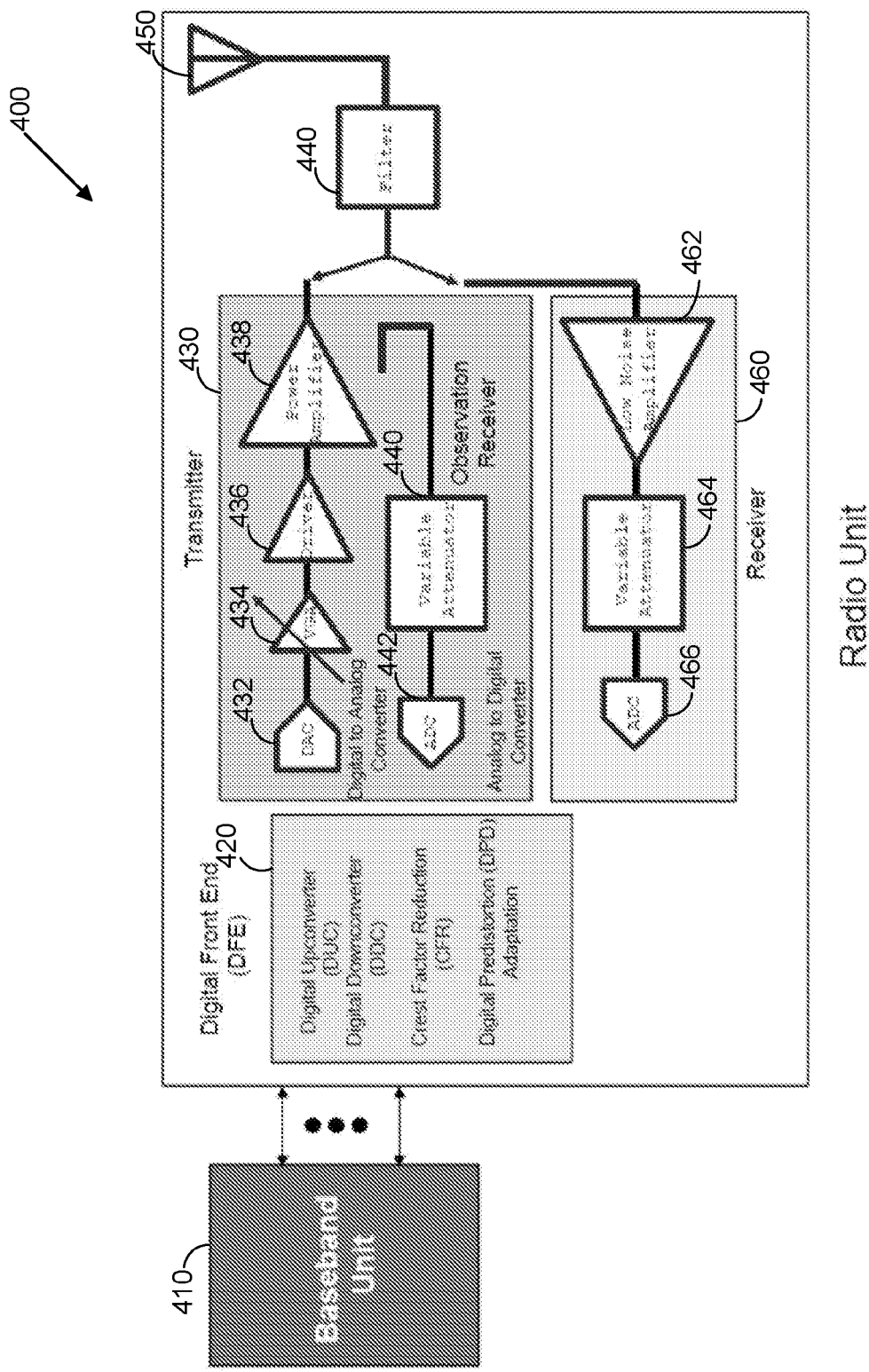
FIG. 4 is a schematic diagram of an example radio in a base station.

With reference next to FIG. 4, a schematic diagram of an example radio unit device 400 (e.g., a network node, such as a WWAN base station, a WLAN access point or, a server, etc.) on which monitoring procedures, such as those described herein with respect to FIGS. 1-3 are implemented, is shown. The system 400 generally includes a baseband unit 410 that produces the baseband signals, such as the signal x shown in FIG. 1, on which processing, including the processing described in relation to FIGS. 1-3, is performed.

A baseband signal is then provided to a digital front end unit 420 that is coupled to the transmitter 430. The digital front end unit 420 and the transmitter 430 together may constitute the system 100 depicted in FIG. 1, and are thus configured to perform adjustable/adaptable digital processing on the signal(s) provided by the baseband unit, along with performance monitoring operations. The digital front end unit 420 may include, inter alia, digital upconverter, a digital downconverter, a crest factor reduction unit (which may be similar, in configuration and/or functionality, to the CFR module 102 of FIG. 1), and/or a digital predistortion adaptation module (which may be similar to, in configuration and/or functionality, to the DPD 104 in combination with the adaptation module 110 of FIG. 1). In some embodiments, and as discussed herein, the digital front end unit 420 may include one or more monitoring sensors (not shown in FIG. 4) to determine respective one or more of system characteristics for the adjustable digital predistortion system. The monitoring sensors may collect, or otherwise obtain data including one or more of: a) data characterizing an input/output characteristic of the digital predistorter, b) data characterizing a performance of the crest factor reduction unit, c) data characterizing a quality of a plurality of parameters associated with the digital predistorter, d) data characterizing an average time delay associated with the adjustable digital predistortion (e.g., average time delay between the transmitter 430 and observation/feedback receiver paths of the transmitter 430), data characterizing an average gain associated with the adjustable digital predistortion, and data characterizing a phase associated with the adjustable digital predistortion. Additional one or more monitoring sensors may be included to sense or collect additional data (such as data characterizing an average output power of the system, e.g., at the output of the DPD module(s), at the output of the transmitter chain, or at other points in the system).

In some implementation, a controller (e.g., a processor-based controller) may be included with the digital front end unit 420, or may be housed elsewhere within the system 400 or be located remotely from the system 400. The controller may be operatively coupled to the adjustable digital predistortion and the one or more monitoring sensors, and be configured to compare at least one of the one or more system characteristics to respective one or more reference values, and to control the adjustable digital predistortion of the system based on a result of the comparing. The controller may include one or more microprocessors, microcontrollers, and/or digital signal processors that provide processing functionality, as well as other computation and control functionality. The controller may also include special purpose logic circuitry, e.g., an FPGA (field programmable gate array), an ASIC (application-specific integrated circuit), a DSP processor, a graphics processing unit (GPU), an accelerated processing unit (APU), an application processor, customized dedicated circuity, etc., to implement, at least in part, the processes and functionality for the system 400, including of the digital front end unit 420. The controller may also include memory for storing data and software instructions for executing programmed functionality within the device. Generally speaking, a computer accessible storage medium may include any non-transitory storage media accessible by a computer during use to provide instructions and/or data to the computer. For example, a computer accessible storage medium may include storage media such as magnetic or optical disks and semiconductor (solid-state) memories, DRAM, SRAM, etc.

With continued reference to FIG. 4, the transmitter 430 (also referred to as the transmitter chain) of the system 400 generally includes a digital-to-analog converter (DAC) 432, which may be coupled to a variable gain amplifier (VGA) 434, that in turn is coupled to a driver 436. The output of the driver is fed to a power amplifiers 438 to produce amplified output signals that are then transmitted (e.g., after being processed by a filter 444 (e.g., a bandpass filter, that can remove unwanted harmonics or other signal noise) via antenna 450. The transmitter 430 may further include an observation receiver (also referred to as an observation path circuitry) to measure the amplified output signals produced by the PA 438 in order to facilitate a DPD adaptation process. The observation receiver includes a variable attenuator 440 whose output is coupled to an analog-to-digital converter (ADC) 442. Signals produced by the observation path circuitry (e.g., to implement a DPD adaptation process) may be provided to, for example, an adaptation module such as the adaptation module 110 of FIG. 1, to perform a DPD adaptation process. As further depicted in FIG. 4, the system 400 includes a receiver 460 to process signals received, via the antenna 450 and the filter 444, from a remote device. The receiver 460 includes a low noise amplifier 462, whose output is coupled to a variable attenuator 464, which in turn is coupled to the input of an analog-to-digital converter 466.

The above implementations, as illustrated in FIGS. 1-4, are applicable to a wide range of technologies that include RF technologies (including WWAN technologies, such as cellular technologies, and WLAN technologies), satellite communication technologies, cable modem technologies, wired network technologies, optical communication technologies, and all other RF and non-RF communication technologies. The implementations described herein encompass all techniques and embodiments that pertain to use of multiband digital predistortion in various different communication systems.

In some implementations, a computer accessible non-transitory storage medium includes a database (also referred to a "design structure" or "integrated circuit definition dataset") representative of a system including some or all of the components of the monitoring implementations described herein for adjustable digital predistortion systems. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates which also represents the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, the database may itself be the netlist (with or without the synthesis library) or the data set.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate in the context of the systems, devices, circuits, methods, and other implementations described herein.

As used herein, including in the claims, "or" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

Although particular embodiments have been disclosed herein in detail, this has been done by way of example for purposes of illustration only, and is not intended to limit the scope of the invention, which is defined by the scope of the appended claims. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

What is claimed is:

1. A method for monitoring performance of a transmitter in a radio with an adjustable digital predistortion system, the adjustable digital predistortion system including a digital predistorter and a crest factor unit operatively coupled to the digital predistorter, the method comprising:
    determining, by one or more sensors, one or more system characteristics, including determining one or more of:
        data characterizing an input/output characteristic of the digital predistorter;
        data characterizing a performance of a crest factor reduction process of the crest factor unit;
        data characterizing a quality of a plurality of parameters associated with the digital predistorter;
        data characterizing an average time delay associated with the adjustable digital predistortion system;
        data characterizing an average gain associated with the adjustable digital predistortion system; and
        data characterizing a phase associated with the adjustable digital predistortion system;
    comparing, by a controller operatively coupled to the digital predistortion system and the one or more sensors, the one or more system characteristics to respective one or more reference values representing pre-determined bounds for value ranges associated with expected behavior of respective units of the adjustable digital predistortion system for which the one or more system characteristics are being determined;
    detecting, by the controller, anomalous behavior of the respective units of the adjustable digital predistortion system in response to a determination, based on the comparing of the one or more system characteristics to the respective one or more reference values representing the pre-determined bounds for value ranges, that a value of at least one of the one or more system characteristics is out-of-bound for the respective value range for the at least one of the one or more system characteristic; and
    controlling, by the controller, the adjustable digital predistortion system based on a result of the comparing.

2. The method of claim 1, wherein determining the one or more system characteristics for the adjustable digital predistortion system of the transmitter comprises:

determining the at least one of the one or more system characteristics based on at least one output of a respective at least one infinite impulse response (IIR) filter configured to determine the at least one of the one or more system characteristics.

3. The method of claim 1, wherein controlling the adjustable digital predistortion system comprises:
generating one or more diagnostic alerts based on the result of the comparing.

4. The method of claim 1, wherein determining the data characterizing the performance of the crest factor reduction process comprises:
determining one or more of: peak-to-average power ratio (PAPR) value computed as a squared value of a peak amplitude of a signal segment divided by a squared root mean square (RMS) value of the signal segment, or a number of peaks in the signal segment not processed through the crest factor reduction process.

5. The method of claim 1, wherein determining the data characterizing the input/output characteristic of the digital predistorter of the adjustable digital predistortion system comprises:
deriving one or more error vector magnitude (EVM) values based on one or more of: an input signal to the digital predistorter, an output signal to the digital predistorter, or coefficients controlling predistortion behavior of the digital predistorter.

6. The method of claim 5, wherein deriving the one or more EVM values comprises:
deriving the one or more EVM values according to a computation of a ratio of a first average power of a difference between the input signal to the digital predistorter and the output signal of the digital predistorter, and a second average power of the input signal to the digital predistorter.

7. The method of claim 5, wherein deriving the one or more EVM values comprises:
deriving the one or more EVM values representative of one or more comparisons of a measured output signal of the digital predistorter to an expected signal of the digital predistorter based on derived digital predistortion (DPD) coefficients for the digital predistorter.

8. The method of claim 5, wherein deriving the one or more EVM values comprises:
computing an exponentially decaying average based on the derived one or more EVM values.

9. The method of claim 5, wherein controlling the adjustable digital predistortion system based on the result of the comparing comprises:
adjusting the coefficients controlling the predistortion behavior of the digital predistorter in response to one or more of: current digital predistortion (DPD) coefficients determined to be out-of-bound, or at least one of the one or more EVM values exceeding an EVM threshold.

10. The method of claim 1, wherein controlling the adjustable digital predistortion system based on the result of the comparing comprises:
configuring the adjustable digital predistortion system to bypass the digital predistorter in response to a determination that an average output power of the adjustable digital predistortion system exceeds a power threshold.

11. The method of claim 1, wherein controlling the adjustable digital predistortion system based on the result of the comparing comprises:
adjusting a delay parameter of the adjustable digital predistortion system based on real-time average of a cross product of synchronization data representative of synchronization behavior of an output of the adjustable digital predistortion system and another signal.

12. The method of claim 1, wherein controlling the adjustable digital predistortion system based on the result of the comparing comprises:
determining whether a subset of the one or more system characteristics are within the pre-determined bounds for the value ranges associated with the expected behavior of the respective units of the adjustable digital predistortion system; and
performing one of:
discarding signal samples directed to an adaptation module to adjust digital predistortion (DPD) coefficients controlling predistortion behavior of the digital predistorter upon a determination that at least part of the subset of the one or more system characteristics corresponds to the signal samples is anomalous,
providing the signal samples directed to the adaptation module when the subset of the one or more system characteristics is determined to be within the normal ranges,
disabling one or more modules of the adjustable digital predistortion system, or
causing a restart of at least one module of the adjustable digital predistortion system configured to compute respective at least one system parameter for the adjustable digital predistortion system.

13. A non-transitory computer readable media programmed with a set of computer instructions executable on a processor that, when executed, cause operations comprising the method steps of claim 1.

14. The method of claim 1, wherein comparing the one or more system characteristics to the respective one or more reference values to detect the anomalous behavior comprises comparing two or more of the plurality of system characteristics to respective reference values to detect the anomalous behavior.

15. A system to monitor a performance of a transmitter in a radio with an adjustable digital predistortion system, the system comprising:
the adjustable digital predistortion system, including a digital predistorter, and a crest factor reduction unit operatively coupled to the digital predistorter;
one or more monitoring sensors to determine respective one or more system characteristics for the adjustable digital predistortion system, including one or more of:
data characterizing an input/output characteristic of the digital predistorter;
data characterizing a performance of the crest factor reduction unit;
data characterizing a quality of a plurality of parameters associated with the digital predistorter;
data characterizing an average time delay associated with the adjustable digital predistortion system;
data characterizing an average gain associated with the adjustable digital predistortion system; and
data characterizing a phase associated with the adjustable digital predistortion system;
a controller operatively coupled to the adjustable digital predistortion system and the one or more monitoring sensors, the controller configured to:
compare at least one of the one or more system characteristics to respective one or more reference values representing pre-determined bounds for value ranges associated with expected behavior of respective units of the adjustable digital predistortion system for which the one or more system characteristics are being determined;

detect anomalous behavior of the respective units of the adjustable digital predistortion system in response to a determination, based on comparison of the one or more system characteristics to the respective one or more reference values representing the pre-determined bounds for value ranges, that a value of at least one of the one or more system characteristics is out-of-bound for the respective value range for the at least one of the one or more system characteristic; and control the adjustable digital predistortion system based on a result of the comparison.

16. The system of claim 15, wherein at least one of the one or more monitoring sensors to determine the respective one or more of the system characteristics for the adjustable digital predistortion system is configured to:

determine the at least one of the one or more system characteristics based on at least one output of a respective at least one infinite impulse response (IIR) filter configured to determine the at least one of the one or more system characteristics.

17. The system of claim 15, wherein the one or more monitoring sensors configured to determine the data characterizing the performance of the crest factor reduction unit include at least one monitoring sensor configured to:

determine one or more of: peak-to-average power ratio (PAPR) value computed as a squared value of a peak amplitude of a signal segment divided by a squared root mean square (RMS) value of the signal segment, or a number of peaks in the signal segment not processed through the crest factor reduction unit.

18. The system of claim 15, wherein the one or more monitoring sensors configured to determining the data characterizing the input/output characteristic of the digital predistorter of the system include at least one monitoring sensor configured to:

derive one or more error vector magnitude (EVM) values based on one or more of: an input signal to the digital predistorter, an output signal to the digital predistorter, or coefficients controlling predistortion behavior of the digital predistorter.

19. The system of claim 18, wherein the at least one monitoring sensor configured to derive the one or more EVM values is configured to:

derive the one or more EVM values according to a computation of a ratio of a first average power of a difference between the input signal to the digital predistorter and the output signal of the digital predistorter, and a second average power of the input signal to the digital predistorter.

20. The system of claim 18, wherein the at least one monitoring sensor configured to derive the one or more EVM values is configured to:

compute an exponentially decaying average based on the derived one or more EVM values.

21. The system of claim 18, wherein the controller configured to control the adjustable digital predistortion system based on the result of the comparison is configured to:

adjust DPD the coefficients controlling predistortion behavior of the digital predistorter in response to one or more of: current digital predistortion (DPD) coefficients determined to be out-of-bound, or at least one of the one or more EVM values exceeding an EVM threshold.

22. The system of claim 15, wherein the controller configured to control the adjustable digital predistortion system based on the result of the comparison is configured to:

configure the adjustable digital predistortion system to bypass the digital predistorter in response to a determination that an average output power of the system exceeds a power threshold.

23. A design structure encoded on a non-transitory machine-readable medium, said design structure comprising elements that, when processed in a computer-aided design system, generate a machine-executable representation of the system of claim 15.

* * * * *